United States Patent
Morimitsu

(10) Patent No.: US 11,181,672 B2
(45) Date of Patent: Nov. 23, 2021

(54) IMAGING DEVICE AND ELECTRONIC APPARATUS

(71) Applicant: Sony Semiconductor Solutions Corporation, Kanagawa (JP)

(72) Inventor: Atsushi Morimitsu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/465,702

(22) PCT Filed: Dec. 12, 2017

(86) PCT No.: PCT/JP2017/044629
§ 371 (c)(1),
(2) Date: May 31, 2019

(87) PCT Pub. No.: WO2018/110573
PCT Pub. Date: Jun. 21, 2018

(65) Prior Publication Data
US 2019/0293848 A1  Sep. 26, 2019

(30) Foreign Application Priority Data
Dec. 13, 2016 (JP) .............................. JP2016-241256

(51) Int. Cl.
*G02B 5/20* (2006.01)
*H01L 27/146* (2006.01)
(Continued)

(52) U.S. Cl.
CPC .............. *G02B 5/201* (2013.01); *G02B 5/20* (2013.01); *H01L 27/14* (2013.01); *H01L 27/146* (2013.01);
(Continued)

(58) Field of Classification Search
CPC ........... G02B 5/201; G02B 5/20; H01L 27/14; H01L 27/146; H01L 27/14621;
(Continued)

(56) References Cited

U.S. PATENT DOCUMENTS 8,748,213 B2   6/2014 Ishsioka
2005/0103983 A1   5/2005 Yamaguchi et al.
(Continued)

FOREIGN PATENT DOCUMENTS

EP   2428993 A2   3/2012
EP   2738810 A1   6/2014
(Continued)

OTHER PUBLICATIONS

Written Opinion and English translation thereof dated Mar. 13, 2018 in connection with International Application No. PCT/JP2017/044629.
(Continued)

*Primary Examiner* — Lin Ye
*Assistant Examiner* — Tuan H Le
(74) *Attorney, Agent, or Firm* — Wolf, Greenfield & Sacks, P.C.

(57) ABSTRACT

The present disclosure relates to an imaging device capable of enhancing an accuracy of detecting a light with a narrow wavelength band, and an electronic apparatus.
An imaging device includes a pixel array including an effective region used for obtaining an image and a surrounding region around the effective region, a plurality of kinds of first optical filters configured to transmit a light with a respective different wavelength are provided in respective pixels in the effective region, a second optical filter having a transmission band with a smaller bandwidth than a bandwidth of a transmission band of the first optical filters is provided in a first pixel in the surrounding region, and a third
(Continued)

optical filter with a difference in transmission band from the second optical filter of a predetermined wavelength or more, or with a transmissivity equal to or lower than a transmissivity of the second optical filter is provided in a second pixel adjacent to the first pixel. The present technology can be applied to a CMOS image sensor, for example.

8 Claims, 35 Drawing Sheets

(51) Int. Cl.
  *H01L 31/0232* (2014.01)
  *H01L 27/14* (2006.01)
  *H04N 9/07* (2006.01)

(52) U.S. Cl.
  CPC .. *H01L 27/14621* (2013.01); *H01L 27/14627* (2013.01); *H01L 31/0232* (2013.01); *H04N 9/07* (2013.01)

(58) Field of Classification Search
  CPC ........... H01L 27/14627; H01L 31/0232; H01L 27/1462; H01L 27/14618; H01L 27/14605; H01L 27/14645; H01L 27/14685; H01L 27/14609; H01L 27/14623; H04N 9/07; H04N 9/04557; H04N 9/04561; H04N 9/045; H04N 2209/045; H04N 9/04551; H04N 9/04552; H04N 9/04553; H04N 9/04555; H04N 9/04559
  See application file for complete search history.

(56) References Cited

U.S. PATENT DOCUMENTS

| | | | |
|---|---|---|---|
| 2008/0079828 A1* | 4/2008 | Izawa | H04N 9/04559 348/294 |
| 2010/0320368 A1 | 12/2010 | Koskinen et al. | |
| 2012/0057055 A1* | 3/2012 | Yokogawa | H04N 9/045 348/273 |
| 2013/0032694 A1* | 2/2013 | Nakata | H01L 27/14645 250/208.1 |
| 2013/0224897 A1 | 8/2013 | Ishioka | |
| 2014/0146207 A1 | 5/2014 | Yokogawa | |
| 2017/0278826 A1 | 9/2017 | Sugizaki et al. | |

FOREIGN PATENT DOCUMENTS

| | | |
|---|---|---|
| JP | 2005175430 A | 6/2005 |
| JP | 2008092247 A | 4/2008 |
| JP | 2012-059865 A | 3/2012 |
| JP | 2013034086 A | 2/2013 |
| JP | 2013-174713 A | 9/2013 |
| WO | WO 2013/015117 A1 | 1/2013 |
| WO | WO 2014/199720 A1 | 12/2014 |
| WO | WO 2016/056396 A1 | 4/2016 |

OTHER PUBLICATIONS

International Preliminary Report on Patentability and English translation thereof dated Jun. 27, 2019 in connection with International Application No. PCT/JP2017/044629.

Extended European Search Report dated Oct. 28, 2019 in connection with European Application No. 17881226.9.

International Search Report and English translation thereof dated Mar. 13, 2018 in connection with International Application No. PCT/JP2017/044629.

* cited by examiner

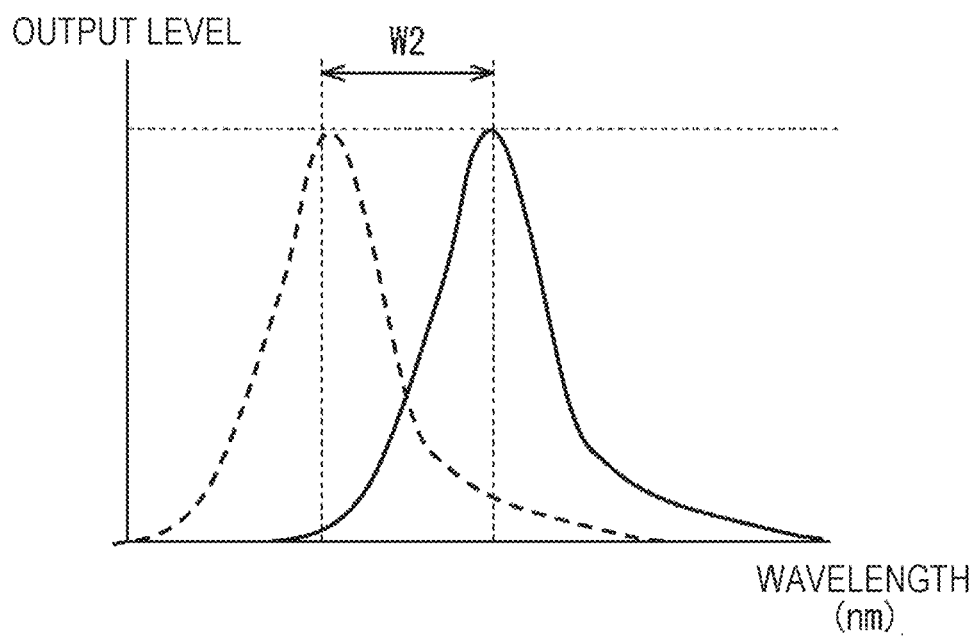

| B | G | B | G | B | G |
|---|---|---|---|---|---|
| G | R | G | R | G | R |
| B | G | MS | MS | B | G |
| G | R | G | R | G | R |
| B | G | B | G | B | G |
| G | R | MS | MS | G | R |

| B | G | B | G | B | G |
|---|---|---|---|---|---|
| G | R | G | R | G | R |
| B | G | MS | MS | B | G |
| G | R | MS | MS | G | R |
| B | G | B | G | B | G |
| G | R | G | R | G | R |

FIG. 36

| OBJECT TO BE DETECTED | ITEM TO BE DETECTED | PEAK WAVELENGTH | HALF BANDWIDTH |
|---|---|---|---|
| MYOGLOBIN | UMAMI | 580-630nm | 30-50nm |
| OLEIC ACID | FRESHNESS | 970nm | 50-100nm |
| CHLOROPHYLL | FRESHNESS | 650-700nm | 50-100nm |

FIG. 37

| FRUITS | OBJECT TO BE DETECTED | ITEM TO BE DETECTED | PEAK WAVELENGTH | HALF BANDWIDTH |
|---|---|---|---|---|
| MELON RAIDEN | SUGAR CONTENT | PULP OPTICAL PATH LENGTH | 880nm | 20-30nm |
| | | SUCROSE | 910nm | 40-50nm |
| MELON RAIDEN RED | SUGAR CONTENT | SUCROSE | 915nm | 40-50nm |
| | | WATER | 955nm | 20-30nm |
| APPLE | SUGAR CONTENT | SUCROSE | 912nm | 40-50nm |
| | WATER | WATER | 844nm | 30nm |
| MANDARIN ORANGE | SUGAR CONTENT | SUCROSE | 914nm | 40-50nm |

FIG. 38

| OBJECT TO BE DETECTED | PEAK WAVELENGTH | HALF BANDWIDTH |
|---|---|---|
| PET | 1669nm | 30-50nm |
| PS | 1688nm | 30-50nm |
| PE | 1735nm | 30-50nm |
| PVC | 1716-1726nm | 30-50nm |
| PP | 1716-1735nm | 30-50nm |

IMAGING DEVICE AND ELECTRONIC APPARATUS

CROSS-REFERENCE TO RELATED APPLICATIONS

This application claims the benefit under 35 U.S.C. § 371 as a U.S. National Stage Entry of International Application No. PCT/JP2017/044629, filed in the Japanese Patent Office as a Receiving Office on Dec. 12, 2017, which claims priority to Japanese Patent Application Number JP 2016-241256, filed in the Japanese Patent Office on Dec. 13, 2016, each of which is hereby incorporated by reference in its entirety.

TECHNICAL FIELD

The technology according to the present disclosure (also denoted as present technology below) relates to an imaging device and an electronic apparatus, and particularly to an imaging device suitably used to detect a light in a narrow wavelength band, and an electronic apparatus.

BACKGROUND ART

There has been conventionally proposed an imaging device in which pixels for detecting a light in a predetermined narrow wavelength band (narrowband) (also denoted as narrowband light below) by use of a plasmon filter are provided around a region used for obtaining an image (see Patent Document 1, for example).

CITATION LIST

Patent Document

Patent Document 1: Japanese Patent Application Laid-Open No. 2012-59865

SUMMARY OF THE INVENTION

Problems to be Solved by the Invention

However, the invention described in Patent Document 1 does not particularly discuss pixels adjacent to a pixel for detecting a narrowband light. Thus, a reduction in detection accuracy is assumed due to an impact of the pixels adjacent to the pixel for detecting a narrowband light.

The present technology has been made in terms of such a situation, and is directed to restricting a reduction in accuracy of detecting a narrowband light.

Solutions to Problems

An imaging device according to a first aspect of the present technology includes a pixel array including an effective region used for obtaining an image and a surrounding region around the effective region, in which a plurality of kinds of first optical filters configured to transmit a light with a respective different wavelength are provided in respective pixels in the effective region, a second optical filter having a transmission band with a shorter bandwidth than a bandwidth of a transmission band of the first optical filters is provided in a first pixel in the surrounding region, and a third optical filter with a difference in transmission band from the second optical filter of a predetermined wavelength or more, or with a transmissivity equal to or lower than a transmissivity of the second optical filter is provided in a second pixel adjacent to the first pixel.

A difference between a peak wavelength of the second optical filter and a peak wavelength of the third optical filter can be set at the predetermined wavelength or more.

A transmissivity at the peak wavelength of the third optical filter can be set to be equal to or lower than a transmissivity at the peak wavelength of the second optical filter.

In a case where a difference in transmission band between the third optical filter and the fourth optical filter is less than the predetermined wavelength, a difference between the transmissivity at the peak wavelength of the second optical filter and the transmissivity at the peak wavelength of the third optical filter can be set at a predetermined threshold or more.

A light shield film can be provided on a light incident side of the second pixel, and the light shield film may not be provided on a light incident side of the first pixel.

An optical filter with a similar transmission band to a transmission band of the second optical filter can be provided in a third pixel with the same image height as an image height of the second pixel.

The second optical filter can be a plasmon filter.

The third optical filter can be any of the plurality of kinds of first optical filters.

An electronic apparatus according to a second aspect of the present technology includes an imaging device, and a signal processing part configured to process a signal output from the imaging device, in which the imaging device includes a pixel array including an effective region used for obtaining an image and a surrounding region around the effective region, a plurality of kinds of first optical filters configured to transmit a light with a respective different wavelength are provided in respective pixels in the effective region, a second optical filter having a transmission band with a smaller bandwidth than a bandwidth of a transmission band of the first optical filters is provided in a first pixel in the surrounding region, and a third optical filter with a difference in transmission band from the second optical filter of a predetermined wavelength or more, or with a transmissivity equal to or lower than a transmissivity of the second optical filter is provided in a second pixel adjacent to the first pixel.

According to the first aspect or the second aspect of the present technology, a narrowband light is detected by the first pixel, and a light with a wider bandwidth than that of the first pixel is detected by the second pixel.

Effects of the Invention

According to the first aspect or the second aspect of the present technology, it is possible to restrict a reduction in accuracy of detecting a light in a narrow wavelength band.

Additionally, the effects described herein are not necessarily restrictive, and any effect described in the present disclosure may be obtained.

BRIEF DESCRIPTION OF DRAWINGS

FIG. 26 is a diagram illustrating a second arrangement of pixels by way of example.

FIG. 27 is a diagram illustrating a second example of spectroscopic characteristics of multispectral pixels and surrounding pixels.

FIG. 30 is a diagram illustrating a fourth arrangement of pixels by way of example.

FIG. 31 is a diagram illustrating a fifth arrangement of pixels by way of example.

FIG. 32 is a diagram illustrating a sixth arrangement of pixels by way of example.

FIG. 33 is a diagram illustrating a seventh arrangement of pixels by way of example.

FIG. 36 is a diagram illustrating exemplary detection bands in a case where umami or freshness of food is detected.

FIG. 37 is a diagram illustrating exemplary detection bands in a case where sugar content or water of a fruit is detected.

FIG. 38 is a diagram illustrating exemplary detection bands in a case where plastics are classified.

MODE FOR CARRYING OUT THE INVENTION

Modes for carrying out the invention (denoted as embodiment below) will be described below with reference to the accompanying drawings. Additionally, the description will be made in the following order.

1. First Embodiment
2. Second Embodiment
3. Variants
4. Applications

1. First Embodiment

A first embodiment of the present technology will be first described with reference to FIG. 1 to FIG. 22.

<Exemplary Configuration of Shooting Apparatus>

Figure 1:
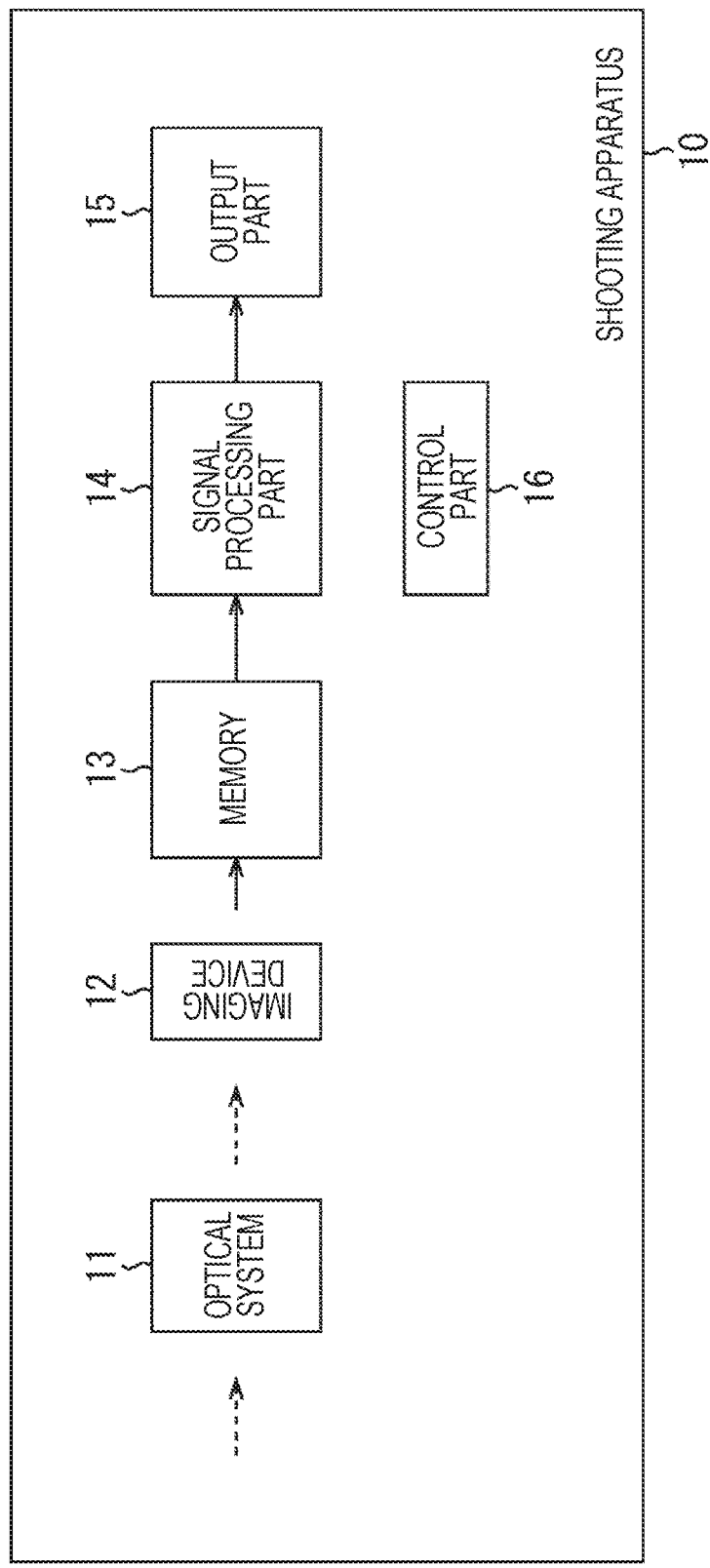
FIG. 1 is a block diagram illustrating one embodiment of a shooting apparatus according to the present technology.

FIG. 1 is a block diagram illustrating one embodiment of a shooting apparatus as a kind of electronic apparatus according to the present technology.

A shooting apparatus 10 of FIG. 1 is configured of a digital camera capable of shooting both a still image and a moving picture, for example. Further, the shooting apparatus 10 is configured of a multispectral camera capable of detecting lights (multispectral) in four or more wavelength bands (four bands or more) more than the conventional three wavelength bands (three bands) of R (red), G (green), and B (blue) or Y (yellow), M (magenta), and C (cyan) based on the three primary colors or the color-matching function, for example.

The shooting apparatus 10 includes an optical system 11, an imaging device 12, a memory 13, a signal processing part 14, an output part 15, and a control part 16.

The optical system 11 includes a zoom lens, a focus lens, a diaphragm, and the like (not illustrated), for example, and puts a light from the outside into the imaging device 12. Further, the optical system 11 is provided with various filters such as polarization filter as needed.

The imaging device 12 is configured of a complementary metal oxide semiconductor (CMOS) image sensor, for example. The imaging device 12 receives an incident light from the optical system 11, photoelectrically converts it, and outputs image data corresponding to the incident light.

The memory 13 temporarily stores the image data output by the imaging device 12.

The signal processing part 14 performs signal processing (processing such as noise cancellation, white balance adjustment, and the like) on the image data stored in the memory 13, and supplies the processed image data to the output part 15.

The output part 15 outputs the image data from the signal processing part 14. For example, the output part 15 has a display (not illustrated) configured of liquid crystal or the like, and displays a spectrum (image) corresponding to the image data from the signal processing part 14 as a through image. For example, the output part 15 includes a driver (not illustrated) for driving a recording medium such as semiconductor memory, magnetic disc, or optical disc, and records the image data from the signal processing part 14 into the recording medium. For example, the output part 15 functions as a communication interface for making communication with an external apparatus (not illustrated), and transmits the image data from the signal processing part 14 to an external apparatus in a wireless or wired manner.

The control part 16 controls each part in the shooting apparatus 10 in response to a user operation or the like.

<Exemplary Configuration of Circuits in Imaging Device>

Figure 2:
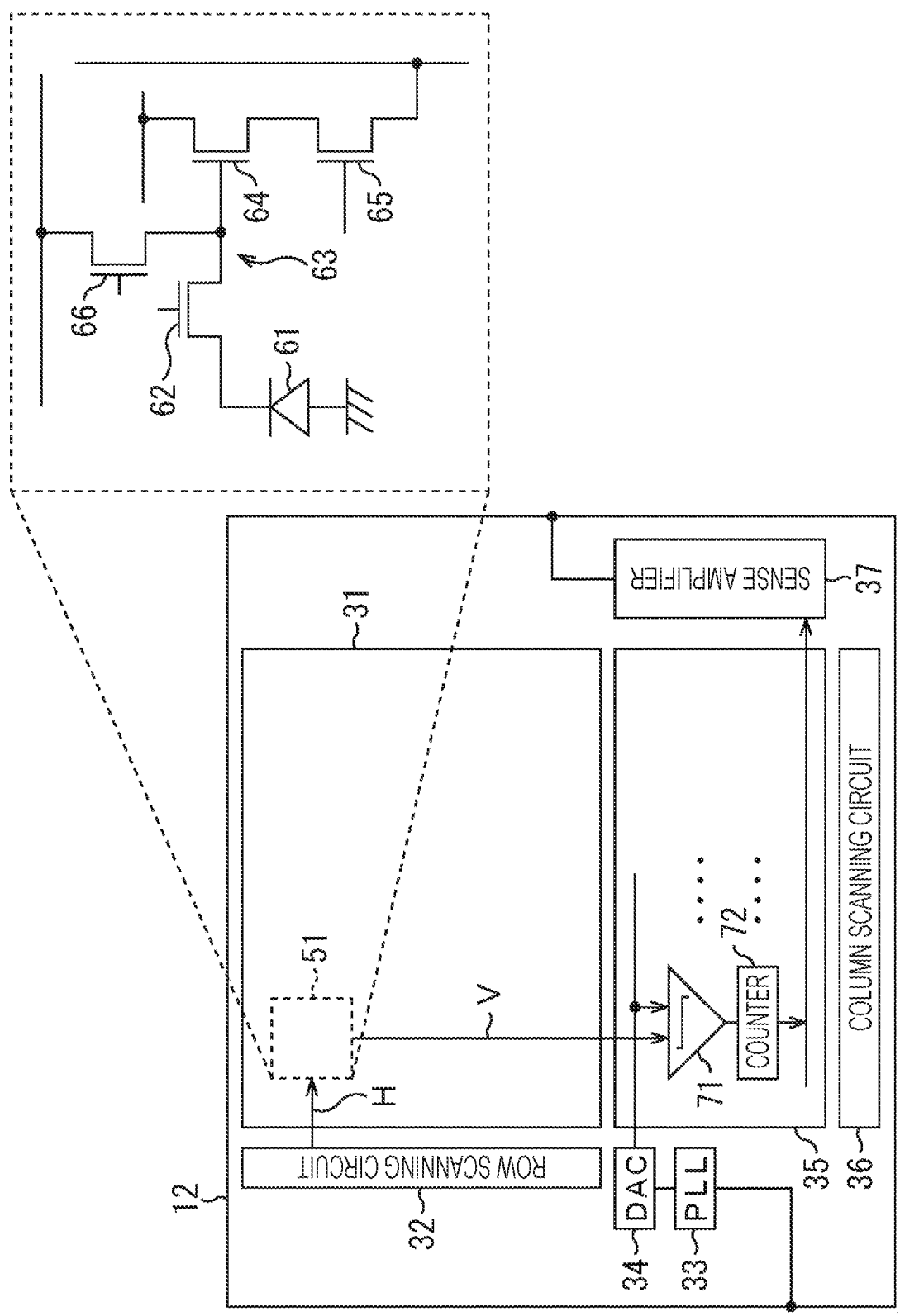
FIG. 2 is a block diagram illustrating an exemplary configuration of circuits in an imaging device.

FIG. 2 is a block diagram illustrating an exemplary configuration of circuits in the imaging device 12 of FIG. 1.

The imaging device 12 includes a pixel array 31, a row scanning circuit 32, a phase locked loop (PLL) 33, a digital analog converter (DAC) 34, a column analog digital converter (ADC) circuit 35, a column scanning circuit 36, and a sense amplifier 37.

A plurality of pixels 51 are two-dimensionally arranged in the pixel array 31.

The pixels 51 are arranged at the points where horizontal signal lines H connected to the row scanning circuit 32 and vertical signal lines V connected to the column ADC circuit 35 cross each other, and each of them includes a photodiode 61 for performing photoelectric conversion and some kinds of transistors for reading an accumulated signal. That is, a pixel 51 includes the photodiode 61, a transfer transistor 62, floating diffusion 63, an amplification transistor 64, a selection transistor 65, and a reset transistor 66 as enlarged on the right of FIG. 2.

Charges accumulated in the photodiode 61 are transferred to the floating diffusion 63 via the transfer transistor 62. The floating diffusion 63 is connected to a gate of the amplification transistor 64. When a signal of a pixel 51 is to be read, the selection transistor 65 is turned on from the row scanning circuit 32 via the horizontal signal line H, and the amplification transistor 64 is source follower driven so that the signal of the selected pixel 51 is read to the vertical signal line V as a pixel signal corresponding to the amount of accumulated charges in the photodiode 61. Further, the reset transistor 66 is turned on so that the pixel signal is reset.

The row scanning circuit 32 sequentially outputs a drive signal for driving (transferring, selecting, resetting, and the like, for example) the pixels 51 in the pixel array 31 per row.

The PLL 33 generates and outputs a clock signal with a predetermined frequency required for driving each part in the imaging device 12 on the basis of a clock signal supplied from the outside.

The DAC 34 generates and outputs a lamp signal in a form (substantially saw-like form) in which a voltage lowers from a predetermined voltage value at a certain tilt and then returns to the predetermined voltage value.

The column ADC circuit 35 has as many comparators 71 and counters 72 as the columns of the pixels 51 in the pixel array 31, extracts signal levels of pixel signals output from the pixels 51 in response to the correlated double sampling (CDS) operation, and outputs image data. That is, the comparator 71 compares the lamp signal supplied from the DAC 34 with the pixel signal (luminance value) output from the pixel 51, and supplies the counter 72 with a resultant comparison result signal. The counter 72 then counts a counter clock signal with a predetermined frequency in response to the comparison result signal output from the comparator 71 so that the pixel signal is A/D converted.

The column scanning circuit 36 supplies the counters 72 in the column ADC circuit 35 with signals for sequentially outputting pixel data at predetermined timings.

The sense amplifier 37 amplifies the pixel data supplied from the column ADC circuit 35, and outputs it outside the imaging device 12.

<First Embodiment of Imaging Device>

Figure 3:
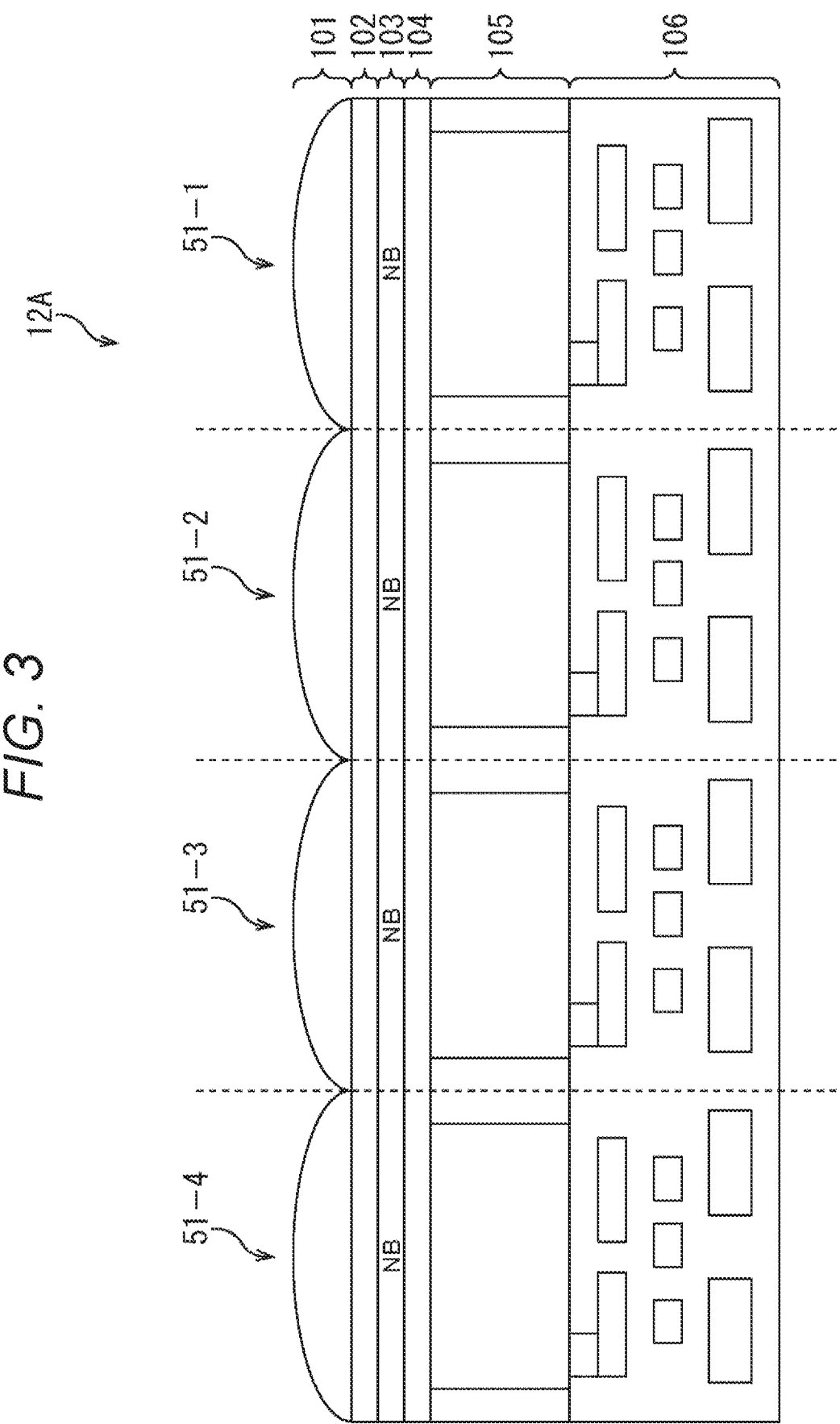
FIG. 3 is a cross-section view schematically illustrating an exemplary configuration of a first embodiment of the imaging device.

FIG. 3 schematically illustrates an exemplary cross-section configuration of an imaging device 12A as a first embodiment of the imaging device 12 of FIG. 1. FIG. 3 illustrates the cross section of four pixels including pixel 51-1 to pixel 51-4 in the imaging device 12. Additionally, in a case where the pixel 51-1 to the pixel 51-4 do not need to be individually discriminated, they will be simply denoted as pixel 51 below.

An on-chip microlens 101, an interlayer film 102, a narrowband filter layer 103, an interlayer film 104, a photoelectric conversion device layer 105, and a signal wiring layer 106 are laminated from the top in each pixel 51. That is, the imaging device 12 is configured of a CMOS image sensor of backside irradiation type in which the photoelectric conversion device layer 105 is arranged closer to the light incident side than the signal wiring layer 106.

The on-chip microlens 101 is an optical device for condensing a light to the photoelectric conversion device layer 105 in each pixel 51.

The interlayer film 102 and the interlayer film 104 include dielectric such as SiO2. As described below, it is desirable that the dielectric constants of the interlayer film 102 and the interlayer film 104 are as low as possible.

The narrowband filter layer 103 is provided with a narrowband filter NB as an optical filter for transmitting a narrowband light in a predetermined narrow wavelength band (narrowband) in each pixel 51. For example, a plasmon filter using surface plasmon, which is a kind of metallic thin film filter using a thin film including metal such as aluminum, is used for the narrowband filter NB. Further, the transmission band of the narrowband filter NB is set per pixel 51. The kinds of transmission bands (the number of bands) of the narrowband filter NB is arbitrary, and is set at four or more, for example.

Here, the narrowband is a wavelength band narrower than the transmission bands of the conventional color filters of R (red), G (green), and B (blue), or Y (yellow), M (magenta), and C (cyan) based on the three primary colors or the color-matching function, for example. Further, a pixel which receives a narrowband light transmitting through the narrowband filter NB will be denoted as multispectral pixel or MS pixel below.

The photoelectric conversion device layer 105 includes the photodiode 61 and the like of FIG. 2, for example, receives a light (narrowband light) transmitting through the narrowband filter layer 103 (the narrowband filter NB) and converts the received light into a charge. Further, the photoelectric conversion device layer 105 is configured such that the respective pixels 51 are electrically separated by the device separation layers.

The signal wiring layer 106 is provided with a wiring or the like for reading the charges accumulated in the photoelectric conversion device layer 105.

<Plasmon Filter>

A plasmon filter capable of being used for the narrowband filter NB will be described below with reference to FIG. 4 to FIG. 15.

Figure 4:
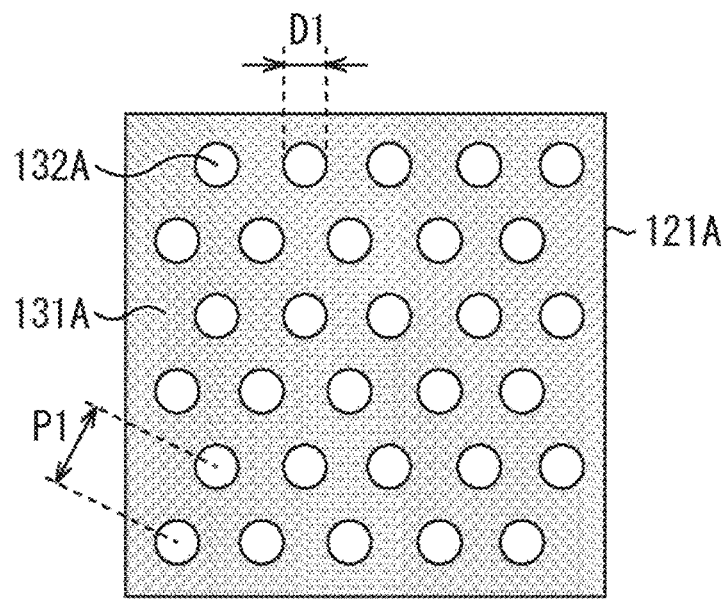
FIG. 4 is a diagram illustrating an exemplary configuration of a plasmon filter in a hole array structure.

FIG. 4 illustrates an exemplary configuration of a plasmon filter 121A in a hole array structure.

The plasmon filter 121A is configured of a plasmon resonator in which holes 132A are arranged in a metallic thin film (denoted as conductive thin film below) 131A in a honeycomb shape.

Each hole 132A penetrates through the conductive thin film 131A, and operates as a waveguide. Generally, a cutoff frequency and a cutoff wavelength, which are determined depending on the shape such as the lengths of the sides or the diameter, are present for the waveguide, and the waveguide has the nature that it does not propagate a light with a frequency than the cutoff frequency (a wavelength more than the cutoff wavelength). The cutoff wavelength of the hole 132A mainly depends on an opening diameter D1, and as the opening diameter D1 is smaller, the cutoff wavelength is also shorter. Additionally, the opening diameter D1 is set to be smaller than the wavelength of a light to be transmitted.

On the other hand, when a light is incident into the conductive thin film 131A in which the holes 132A are periodically formed at a short cycle than the wavelength of the light, there occurs a phenomenon that a light with a longer wavelength than the cutoff wavelength of the holes 132A transmits. The phenomenon is denoted as plasmon abnormal transmission phenomenon. The phenomenon occurs when surface plasmon is excited on the border between the conductive thin film 131A and the interlayer film 102 arranged thereon.

The conditions under which the plasmon abnormal transmission phenomenon (surface plasmon resonance) occurs will be described herein with reference to FIG. 5.

Figure 5:
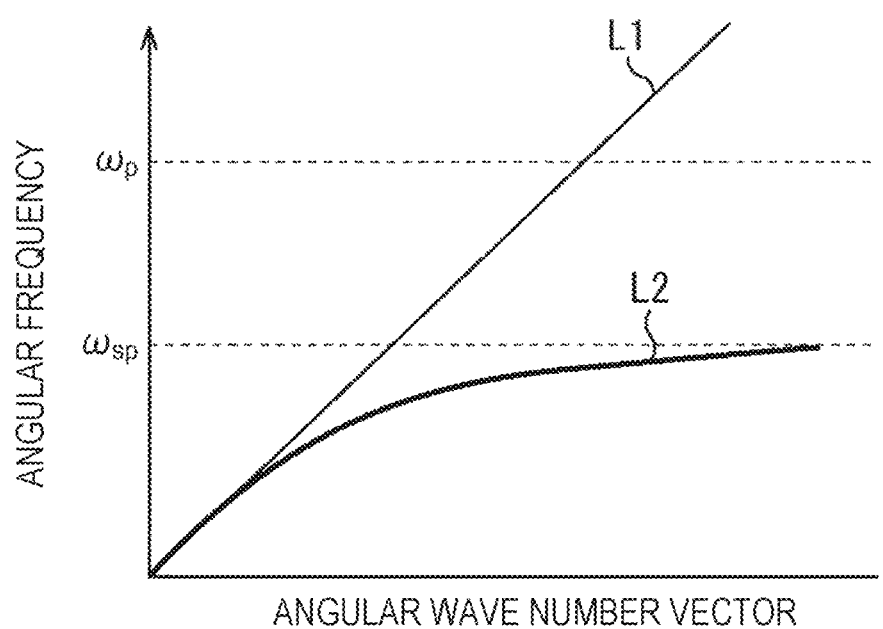
FIG. 5 is a graph illustrating a dispersion relationship of surface plasmon.

FIG. 5 is a graph illustrating a dispersion relationship of the surface plasmon. The horizontal axis in the graph indicates an angular wave number vector k and the vertical axis indicates an angular frequency $\omega$. $\omega_p$ indicates a plasma frequency of the conductive thin film 131A. $\omega_{sp}$ indicates a surface plasma frequency on the border face between the interlayer film 102 and the conductive thin film 131A, and is expressed in the following Equation (1).

[Math. 1]

$$\omega_{sp} = \frac{\omega_p}{\sqrt{1+\varepsilon_d}} \quad (1)$$

$\varepsilon_d$ indicates a dielectric constant of the dielectric configuring the interlayer film 102.

In Equation (1), the surface plasma frequency $\omega_{sp}$ is higher as the plasma frequency $\omega_p$ is higher. Further, the surface plasma frequency $\omega_{sp}$ is higher as the dielectric constant $\varepsilon_d$ is lower.

The line L1 indicates a dispersion relationship of light (light line), and is expressed in the following Equation (2).

[Math. 2]

$$\omega = \frac{c}{\sqrt{\varepsilon_d}} k \quad (2)$$

c indicates a light speed.

The line L2 indicates a dispersion relationship of surface plasmon, and is expressed in the following Equation (3).

[Math. 3]

$$\omega = ck\sqrt{\frac{\varepsilon_m+\varepsilon_d}{\varepsilon_m\varepsilon_d}} \quad (3)$$

$\varepsilon_m$ indicates a dielectric constant of the conductive thin film 131A.

The dispersion relationship of surface plasmon indicated by the line L2 asymptotically approaches the light line indicated by the line L1 in a range where the angular wave number vector k is small, and asymptotically approaches the surface plasma frequency $\omega_{sp}$ as the angular wave number vector k is larger.

Then, when the following Equation (4) is established, the plasmon abnormal transmission phenomenon occurs.

[Math. 4]

$$\text{Re}\left[\frac{\omega_{sp}}{c}\sqrt{\frac{\varepsilon_m\varepsilon_d}{\varepsilon_m+\varepsilon_d}}\right] = \left|\frac{2\pi}{\lambda}\sin\theta + iG_x + jG_y\right| \quad (4)$$

$\lambda$ indicates a wavelength of an incident light. $\theta$ indicates an incident angle of an incident light. $G_x$ and $G_y$ are expressed in the following Equation (5).

$$|G_x|=|G_y|=2\pi/a_0 \quad (5)$$

$a_0$ indicates a lattice constant of the hole array structure configured of the holes 132A in the conductive thin film 131A.

The left side in Equation (4) indicates an angular wave number vector of surface plasmon, and the right side indicates an angular wave number vector of the hole array cycle of the conductive thin film 131A. Thus, when the angular wave number vector of surface plasmon equals to the angular wave number vector of the hole array cycle of the conductive thin film 131A, the plasmon abnormal transmission phenomenon occurs. Then, the value of A at this time is a plasmon resonance wavelength (transmission wavelength of the plasmon filter 121A).

Additionally, the angular wave number vector of surface plasmon in the left side of Equation (4) is determined by the dielectric constant $\varepsilon_m$ of the conductive thin film 131A and the dielectric constant $\varepsilon_d$ of the interlayer film 102. On the other hand, the angular wave number vector of the hole array cycle in the right side is determined by the light incident angle $\theta$, and a pitch (hole pitch) P1 between adjacent holes 132A in the conductive thin film 131A. Thus, the resonance wavelength and the resonance frequency of plasmon are determined by the dielectric constant $\varepsilon_m$ of the conductive thin film 131A, the dielectric constant $\varepsilon_d$ of the interlayer film 102, the light incident angle $\theta$, and the hole pitch P1. Additionally, in a case where the light incident angle is 0°, the resonance wavelength and the resonance frequency of plasmon are determined by the dielectric constant cm of the conductive thin film 131A, the dielectric constant $\varepsilon_d$ of the interlayer film 102, and the hole pitch P1.

Therefore, the transmission band of the plasmon filter 121A (the resonance wavelength of plasmon) changes due to the material and film thickness of the conductive thin film 131A, the material and film thickness of the interlayer film 102, the pattern cycle of the hole array (the opening diameter D1 and the hole pitch P1 of the holes 132A, for example), and the like. Particularly in a case where the materials and film thicknesses of the conductive thin film 131A and the interlayer film 102 are determined, the transmission band of the plasmon filter 121A changes due to the pattern cycle of the hole array, particularly the hole pitch P1. That is, the transmission band of the plasmon filter 121A shifts toward the shorter wavelength side as the hole pitch P1 is narrower, and the transmission band of the plasmon filter 121A shifts toward the longer wavelength side as the hole pitch P1 is wider.

Figure 6:
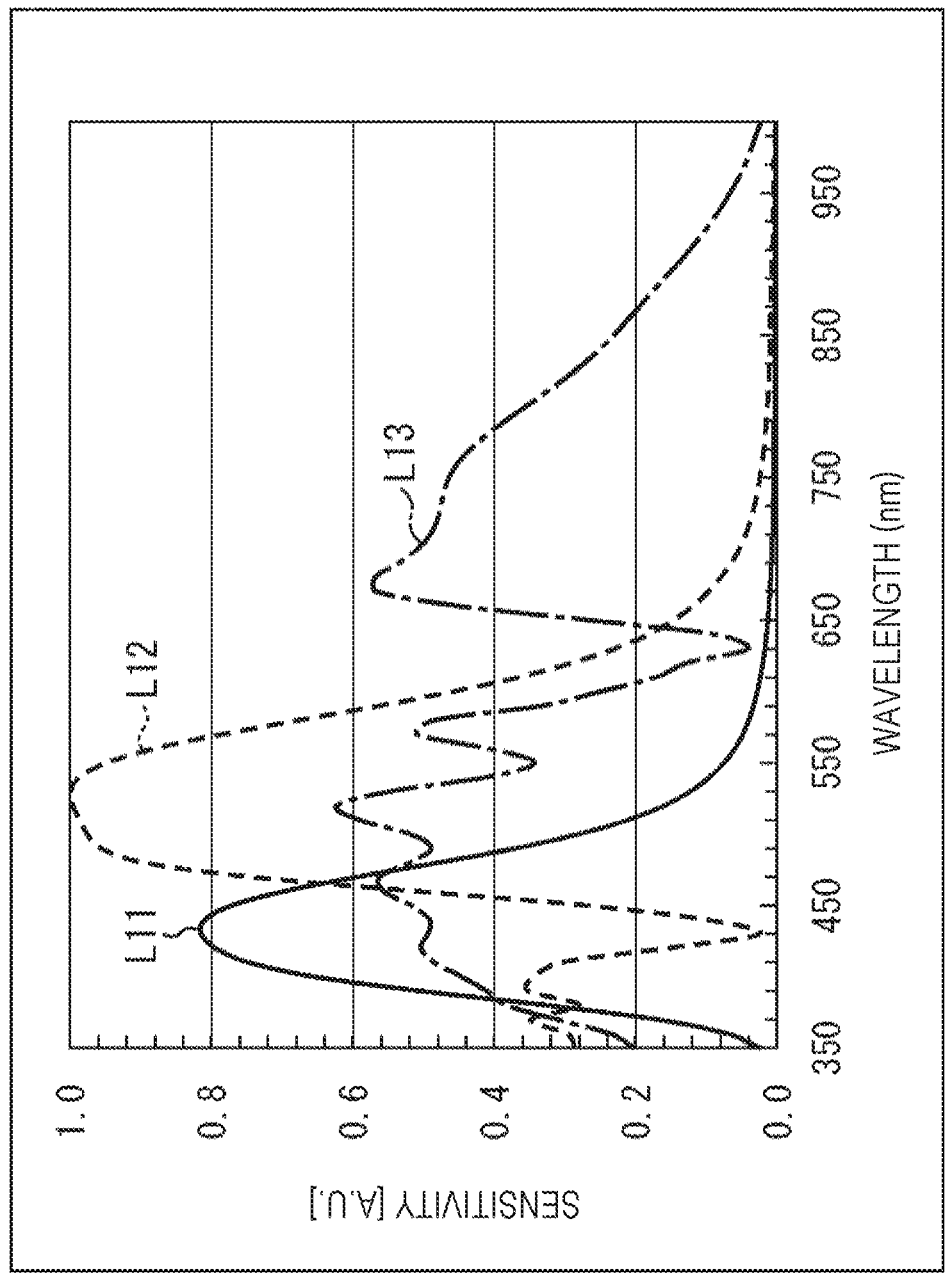
FIG. 6 is a graph illustrating a first example of spectroscopic characteristics of the plasmon filter in the hole array structure.

FIG. 6 is a graph illustrating exemplary spectroscopic characteristics of the plasmon filter 121A in a case where the hole pitch P1 is changed. The horizontal axis in the graph indicates a wavelength (nm) and the vertical axis indicates a sensitivity (arbitrary unit). The line L11 indicates spectroscopic characteristics in a case where the hole pitch P1 is set at 250 nm, the line L12 indicates spectroscopic characteristics in a case where the hole pitch P1 is set at 325 nm, and the line L13 indicates spectroscopic characteristics in a case where the hole pitch P1 is set at 500 nm.

In a case where the hole pitch P1 is set at 250 nm, the plasmon filter 121A mainly transmits a light in the blue wavelength band. In a case where the hole pitch P1 is set at 325 nm, the plasmon filter 121A mainly transmits a light in the green wavelength band. In a case where the hole pitch P1 is set at 500 nm, the plasmon filter 121A mainly transmits a light in the red wavelength band. In a case where the hole pitch P1 is set at 500 nm, however, the plasmon filter 121A transmits more lights in lower wavelength bands than red due to the waveguide mode described below.

Figure 7:
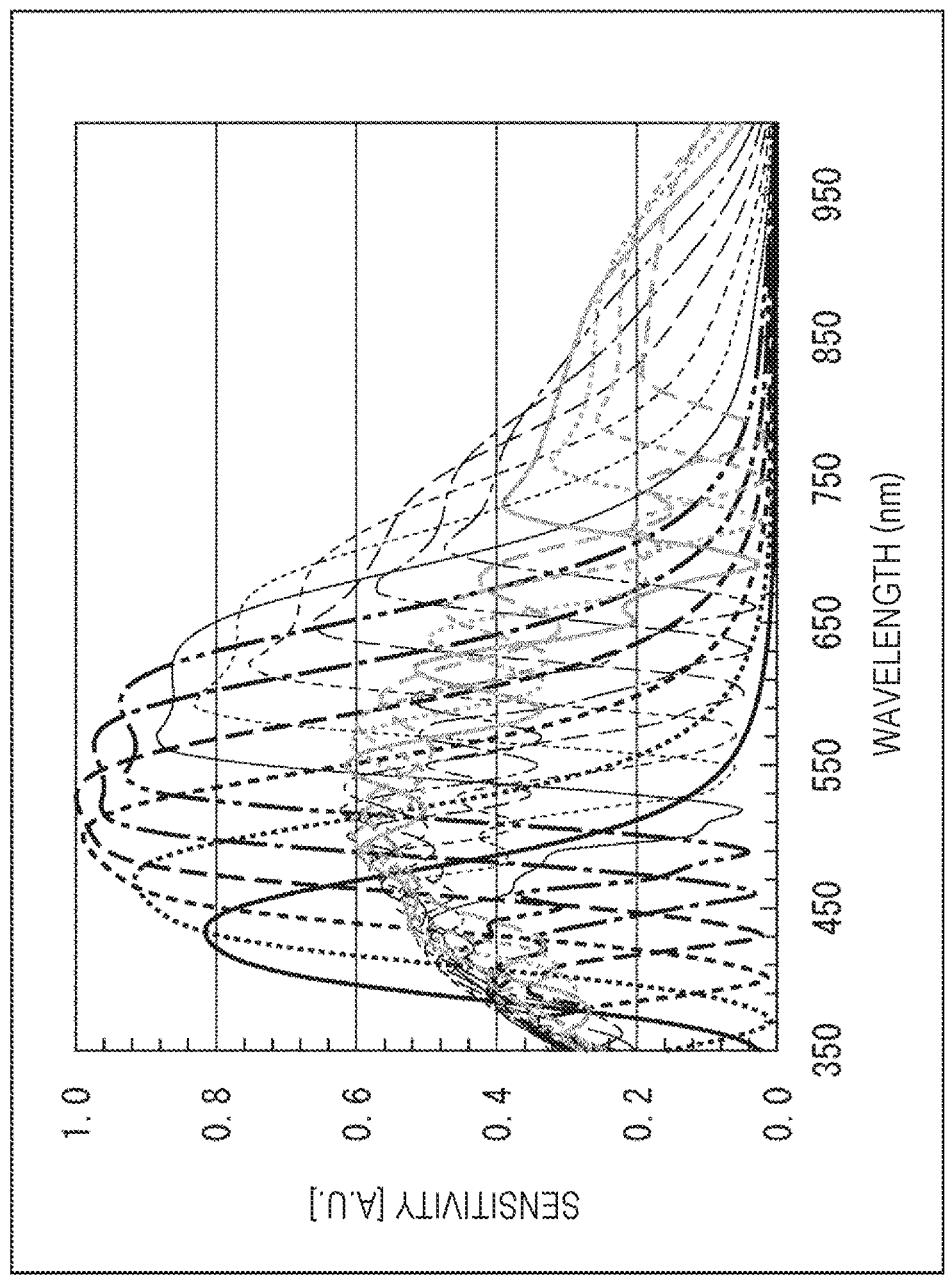
FIG. 7 is a graph illustrating a second example of the spectroscopic characteristics of the plasmon filter in the hole array structure.

FIG. 7 is a graph illustrating other exemplary spectroscopic characteristics of the plasmon filter 121A in a case where the hole pitch P1 is changed. The horizontal axis in the graph indicates a wavelength (nm), and the vertical axis indicates a sensitivity (arbitrary unit). This example indicates exemplary spectroscopic characteristics of 16 kinds of plasmon filters 121A in a case where the hole pitch P1 is changed from 250 nm to 625 nm by 25 nm.

Additionally, the transmissivity of the plasmon filter 121A is mainly determined by the opening diameter D1 of the holes 132A. As the opening diameter D1 is larger, the transmissivity is higher while color mixture easily occurs. Generally, it is desirable that the opening diameter D1 is set such that the aperture is 50% to 60% of the hole pitch P1.

Further, as described above, each hole 132A in the plasmon filter 121A operates as a waveguide. Thus, not only the wavelength component transmitted due to surface plasmon resonance (the wavelength component in the plasmon mode) but also the wavelength component transmitting through the holes 132A (the wavelength component in the waveguide mode) may be larger in the spectroscopic characteristics depending on a pattern of the hole array of the plasmon filter 121A.

Figure 8:
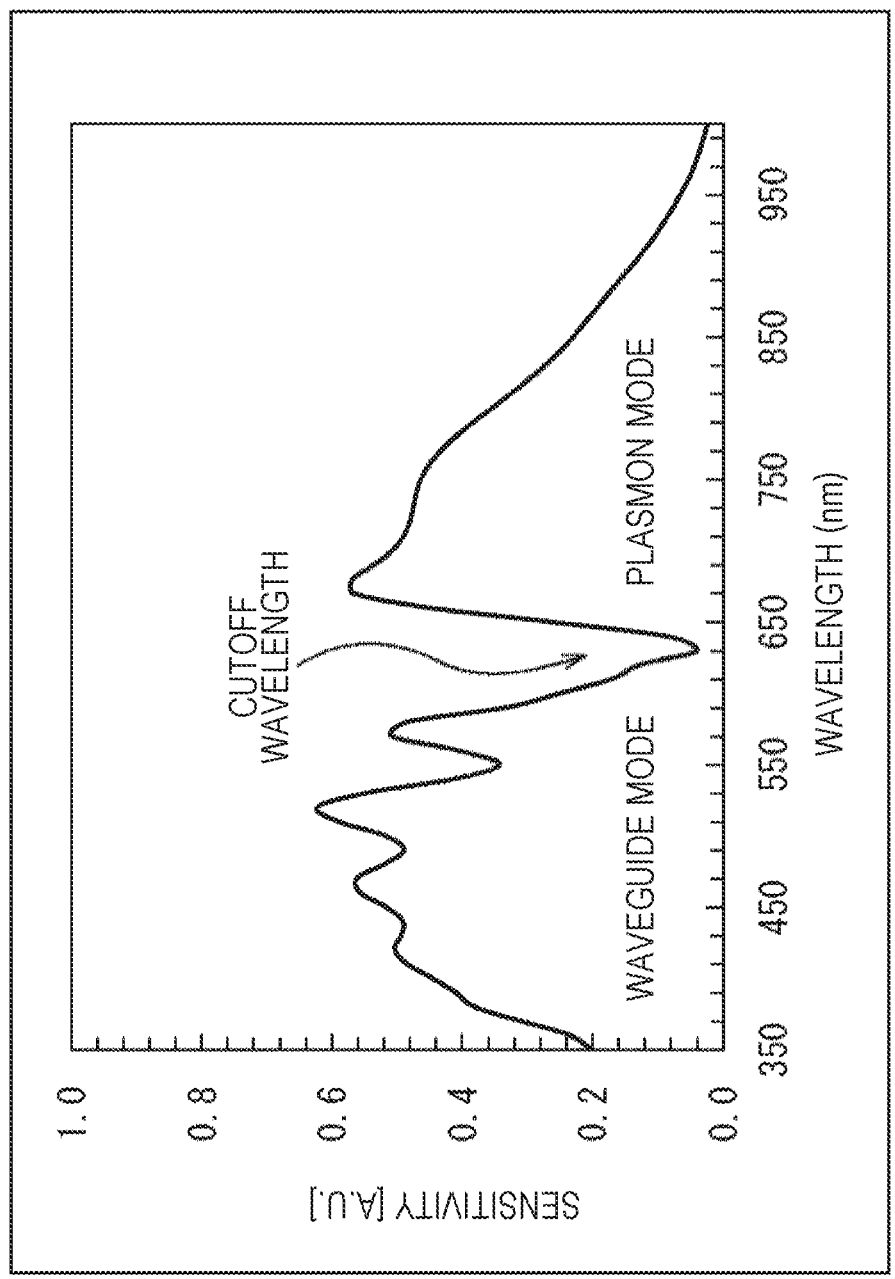
FIG. 8 is a graph illustrating a plasmon mode and a waveguide mode.

FIG. 8 illustrates spectroscopic characteristics of the plasmon filter 121A in a case where the hole pitch P1 is set at 500 nm similarly to the spectroscopic characteristics indicated by the line L13 of FIG. 6. In this example, a longer wavelength than the cutoff wavelength of around 630 nm is a wavelength component in the plasmon mode, and a shorter wavelength than the cutoff wavelength is a wavelength component in the waveguide mode.

As described above, the cutoff wavelength mainly depends on the opening diameter D1 of the holes 132A, and the cutoff wavelength is also shorter as the opening diameter D1 is shorter. Then, as a difference between the cutoff wavelength and a peak wavelength in the plasmon mode is made larger, the wavelength resolution characteristics of the plasmon filter 121A enhance.

Further, as described above, as the plasma frequency $\omega_p$ of the conductive thin film 131A is higher, the surface plasma frequency $\omega_{sp}$ of the conductive thin film 131A is higher. Further, as the dielectric constant $\varepsilon_d$ of the interlayer film 102 is lower, the surface plasma frequency $\omega_{sp}$ is higher. Then, as the surface plasma frequency $\omega_{sp}$ is higher, the plasmon resonance frequency can be set to be higher, and the transmission band (plasmon resonance wavelength) of the plasmon filter 121A can be set in a shorter wavelength band.

Thus, when a metal with the lower plasma frequency $\omega_p$ is used for the conductive thin film 131A, the transmission band of the plasmon filter 121A can be set in a shorter wavelength band. For example, aluminum, silver, gold, and the like are preferable. However, in a case where the transmission band is set in a longer wavelength band such as infrared ray, copper and the like can be used.

Further, when a dielectric with the lower dielectric constant $\varepsilon_d$ is used for the interlayer film 102, the transmission band of the plasmon filter 121A can be set in a shorter wavelength band. For example, SiO2, Low-K, and the like are preferable.

Figure 9:
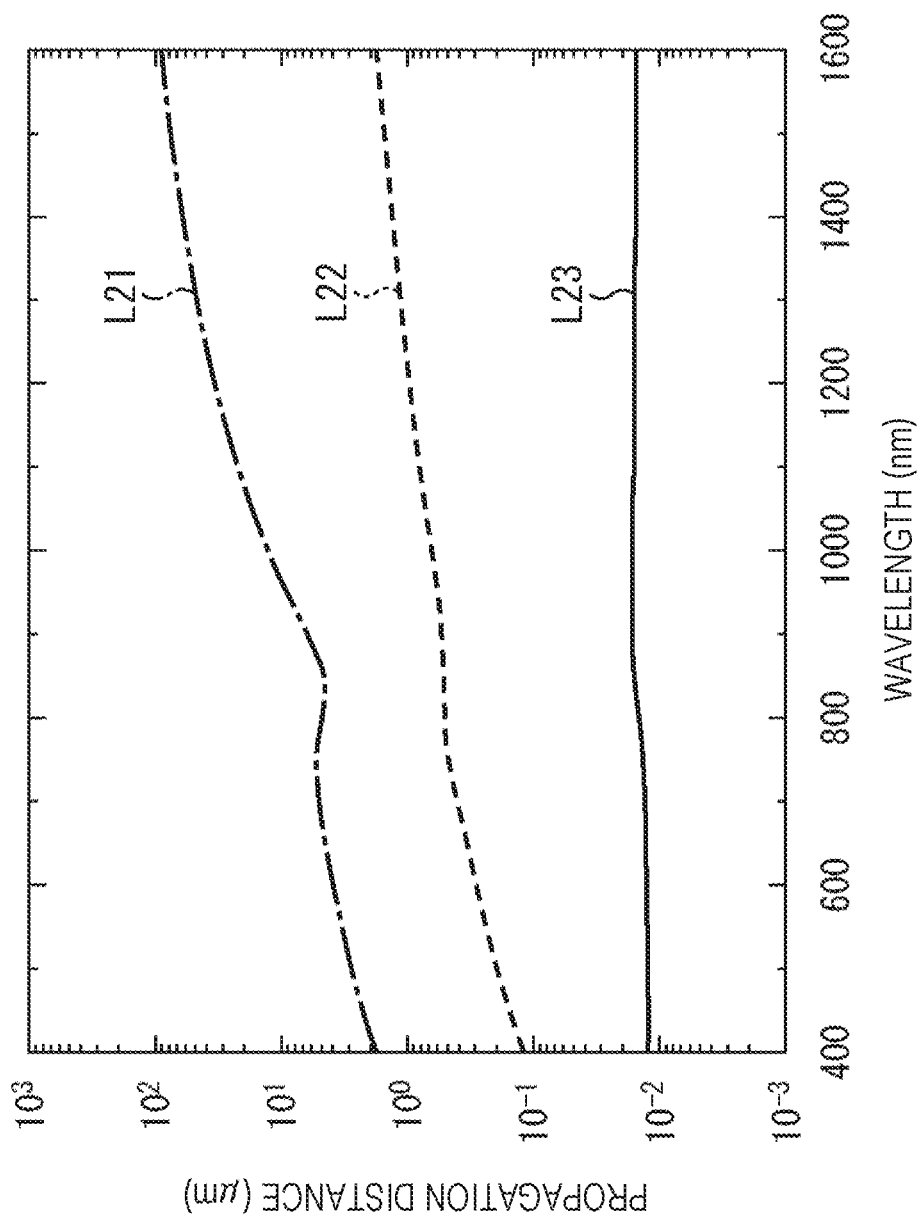
FIG. 9 is a graph illustrating exemplary propagation characteristics of the surface plasmon.

Further, FIG. 9 is a graph illustrating propagation characteristics of surface plasmon on the interface between the conductive thin film 131A and the interlayer film 102 in a case where aluminum is used for the conductive thin film 131A and SiO2 is used for the interlayer film 102. The horizontal axis in the graph indicates a light wavelength (nm), and the vertical axis indicates a propagation distance (μm). Further, the line L21 indicates propagation characteristics in the interface direction, the line L22 indicates propagation characteristics in the depth direction of the interlayer film 102 (in the direction vertical to the interface), and the line L23 indicates propagation characteristics in the depth direction of the conductive thin film 131A (in the direction vertical to the interface).

A propagation distance $\Lambda_{SPP}(\lambda)$ in the depth direction of the surface plasmon is expressed in the following Equation (6).

[Math. 5]

$$\Lambda_{SPP}(\lambda) \equiv \frac{4\pi k_{SPP}}{\lambda} = \frac{4\pi}{\lambda} \text{Im}\left[\sqrt{\frac{\varepsilon_m \varepsilon_d}{\varepsilon_m + \varepsilon_d}}\right] \qquad (6)$$

$k_{SPP}$ indicates an absorption coefficient of a material propagated by the surface plasmon. $\varepsilon_m(\lambda)$ indicates a dielectric constant of the conductive thin film 131A relative to a light with a wavelength $\lambda$. $\varepsilon_d(\lambda)$ indicates a dielectric constant of the interlayer film 102 relative to the light with the wavelength $\lambda$.

Thus, as illustrated in FIG. 9, the surface plasmon relative to a light with a wavelength of 400 nm propagates down to about 100 nm in the depth direction from the surface of the interlayer film 102 including SiO2. Therefore, the thickness of the interlayer film 102 is set at 100 nm or more so that a material laminated on the opposite side to the conductive thin film 131A of the interlayer film 102 is prevented from influencing the surface plasmon on the interface between the interlayer film 102 and the conductive thin film 131A.

Further, the surface plasmon relative to the light with a wavelength of 400 nm propagates down to about 10 nm in the depth direction from the surface of the conductive thin film 131A including aluminum. Thus, the thickness of the conductive thin film 131A is set at 10 nm or more so that the interlayer film 104 is prevented from influencing the surface plasmon on the interface between the interlayer film 102 and the conductive thin film 131A.

<Other Exemplary Plasmon Filters>

Other exemplary plasmon filters will be described below with reference to FIG. 10 to FIG. 15.

Figure 10:
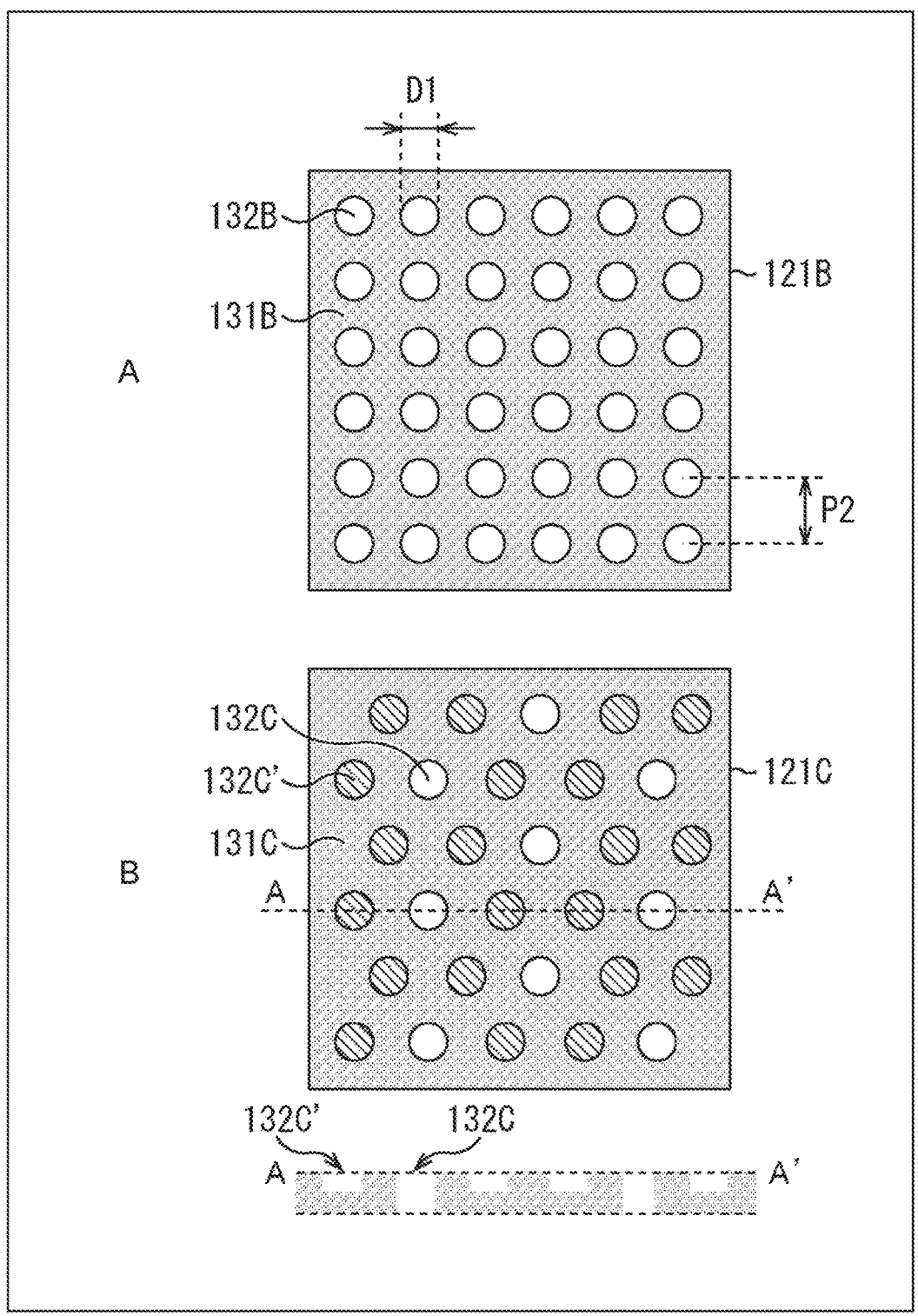
FIG. 10 is diagrams illustrating other exemplary configurations of the plasmon filter in the hole array structure.

A plasmon filter 121B in A of FIG. 10 is configured of a plasmon resonator in which holes 132B are arranged in a conductive thin film 131B in an orthogonal matrix shape. For example, the transmission band changes due to a pitch P2 between adjacent holes 132B in the plasmon filter 121B.

Further, all the holes do not need to penetrate through the conductive thin film in the plasmon resonator, and the plasmon resonator functions as a filter even if some holes are configured as non-through holes which do not penetrate through the conductive thin film.

For example, B of FIG. 10 illustrates a plan view and a cross-section view (cross-section view along A-A' in the plan view) of a plasmon filter 121C in which holes 132C as through holes and holes 132C' as non-through holes are arranged in a conductive thin film 131C in a honeycomb shape. That is, the holes 132C as through holes and the holes 132C' as non-through holes are periodically arranged in the plasmon filter 121C.

Further, the plasmon filter basically uses a single-layer plasmon resonator, but may be configured of a double-layer plasmon resonator, for example.

Figure 11:
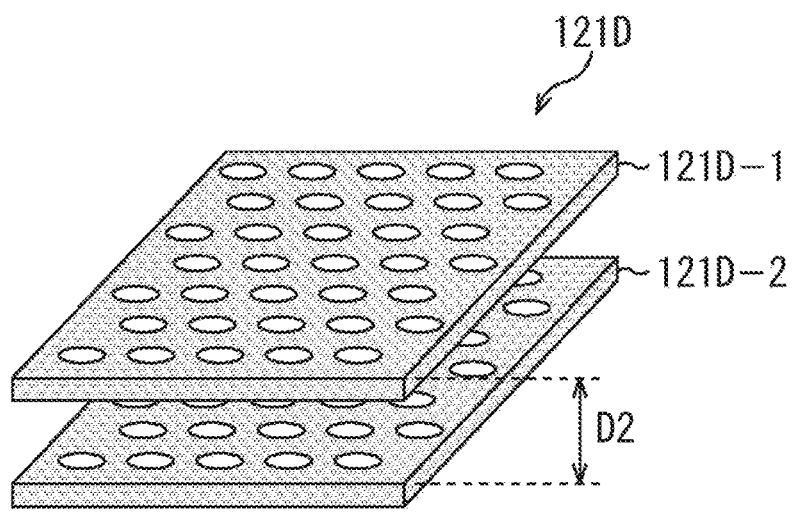
FIG. 11 is a diagram illustrating an exemplary configuration of a plasmon filter in a double-layer structure.

For example, a plasmon filter 121D illustrated in FIG. 11 is configured in two layers including a plasmon filter 121D-1 and a plasmon filter 121D-2. The plasmon filter 121D-1 and the plasmon filter 121D-2 are configured such that holes are arranged in a honeycomb shape similarly to the plasmon resonator configuring the plasmon filter 121A of FIG. 4.

Further, an interval D2 between the plasmon filter 121D-1 and the plasmon filter 121D-2 is preferably set at about ¼ of the peak wavelength of the transmission band. Further, the interval D2 is more preferably at ½ or less of the peak wavelength of the transmission band in consideration of a degree of freedom of design.

Additionally, as in the plasmon filter 121D, the holes may be arranged in the same pattern in the plasmon filter 121D-1 and the plasmon filter 121D-2, and additionally the holes may be arranged in the mutually similar patterns in the double-layer plasmon resonator structure, for example. Further, in the double-layer plasmon resonator structure, holes and dots may be arranged in a pattern in which the hole array structure and the dot array structure (described below) are inverted. Furthermore, the plasmon filter 121D is in the double-layer structure, but may be multilayered in three or more layers.

Further, the exemplary configurations of the plasmon filters configured of a plasmon resonator in a hole array structure have been described above, but a plasmon resonator in a dot array structure may be employed for the plasmon filter.

A plasmon filter in a dot array structure will be described with reference to FIG. 12.

Figure 12:
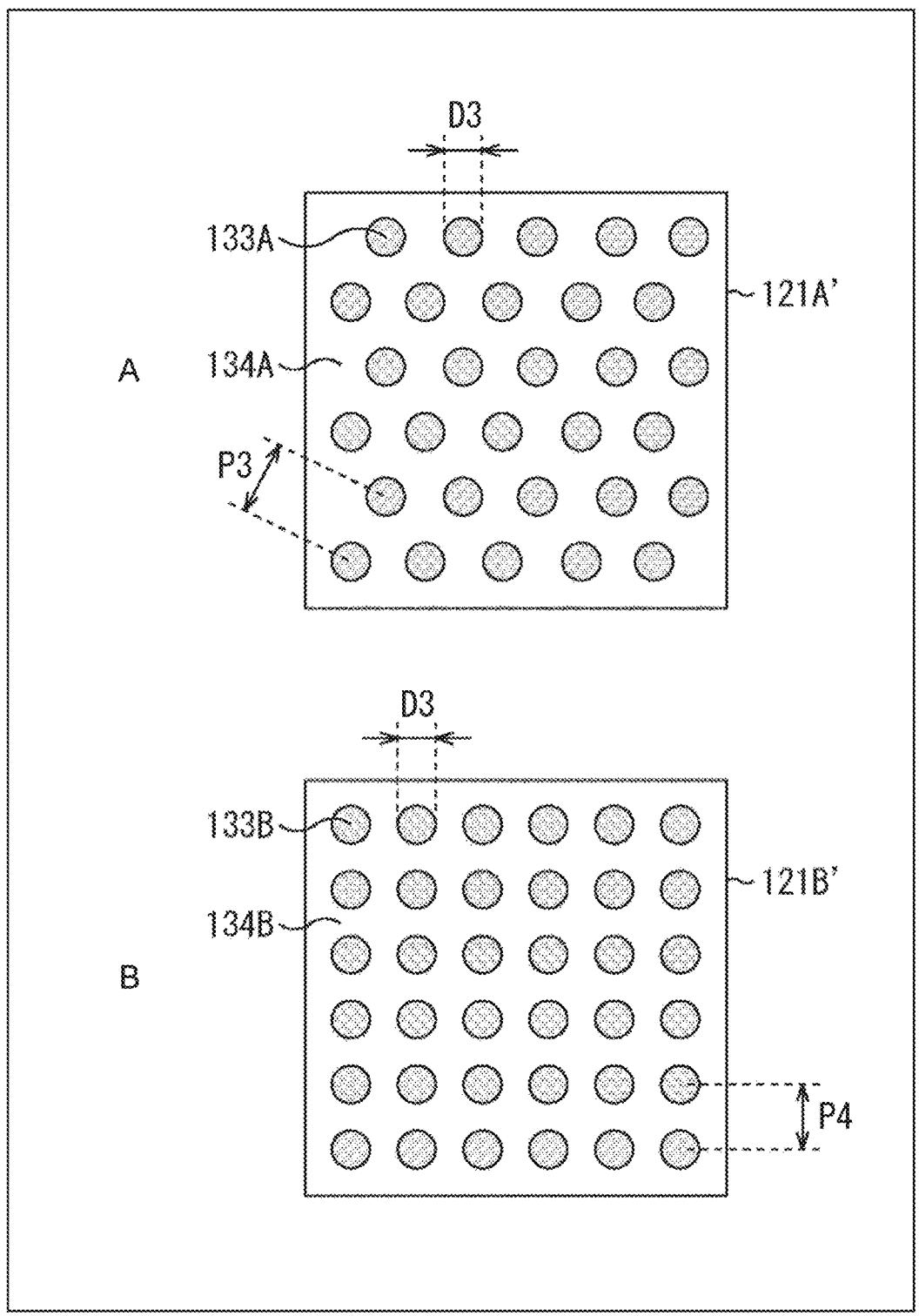
FIG. 12 is diagrams illustrating exemplary configurations of a plasmon filter in a dot array structure.

A plasmon filter 121A' in A of FIG. 12 is configured to be negative-positive inverted to the plasmon resonator of the plasmon filter 121A of FIG. 4, or is configured of a plasmon resonator in which dots 133A are arranged in a dielectric layer 134A in a honeycomb shape. The dielectric layer 134A is filled between the dots 133A.

The plasmon filter 121A' absorbs a light in a predetermined wavelength band, and thus is used as a complementary color-based filter. The wavelength band (denoted as absorption band below) of a light absorbed by the plasmon filter 121A' changes due to a pitch (denoted as dot pitch below) P3 between adjacent dots 133A, or the like. Further, a diameter D3 of the dots 133A is adjusted according to the dot pitch P3.

A plasmon filter 121B' in B of FIG. 12 is configured to be negative-positive inverted to the plasmon resonator of the plasmon filter 121B in A of FIG. 10, or is configured in a plasmon resonator structure in which dots 133B are arranged in a dielectric layer 134B in an orthogonal matrix shape. The dielectric layer 134B is filled between the dots 133B.

The absorption band of the plasmon filter 121B' changes due to a dot pitch P4 between adjacent dots 133B, or the like. Further, the diameter D3 of the dots 133B is adjusted according to the dot pitch P4.

Figure 13:
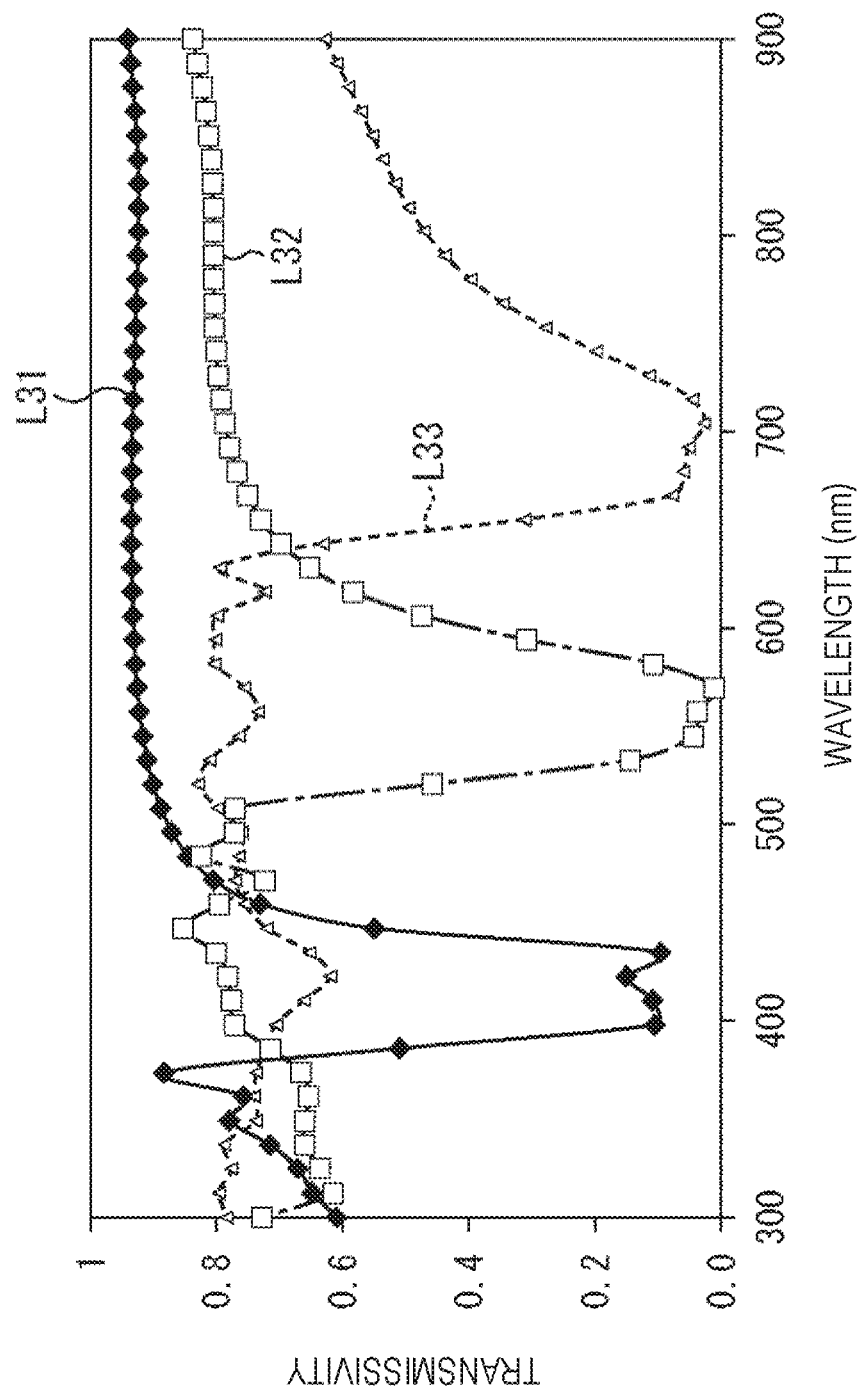
FIG. 13 is a graph illustrating exemplary spectroscopic characteristics of the plasmon filter in the dot array structure.

FIG. 13 is a graph illustrating exemplary spectroscopic characteristics in a case where the dot pitch P3 of the plasmon filter 121A' in A of FIG. 12 is changed. The horizontal axis in the graph indicates a wavelength (nm), and the vertical axis indicates a transmissivity. The line L31 indicates spectroscopic characteristics in a case where the dot pitch P3 is set at 300 nm, the line L32 indicates spectroscopic characteristics in a case where the dot pitch P3 is set at 400 nm, and the line L33 indicates spectroscopic characteristics in a case where the dot pitch P3 is set at 500 nm.

As illustrated, as the dot pitch P3 is narrower, the absorption band of the plasmon filter 121A' shifts toward the shorter wavelength side, and as the dot pitch P3 is wider, the absorption band of the plasmon filter 121A' shifts toward the longer wavelength side.

Additionally, the transmission band or the absorption band can be adjusted only by adjusting a pitch of holes or dots in the plane direction also in any plasmon filter in the hole array structure and in the dot array structure. Thus, for example, the transmission band or the absorption band can be individually set per pixel only by adjusting a pitch of holes or dots in a lithography step, thereby achieving more colors of the filter in less steps.

Further, the thickness of the plasmon filter is almost similar to an organic material-based color filter at about 100 to 500 nm, and is excellent in process affinity.

Figure 14:
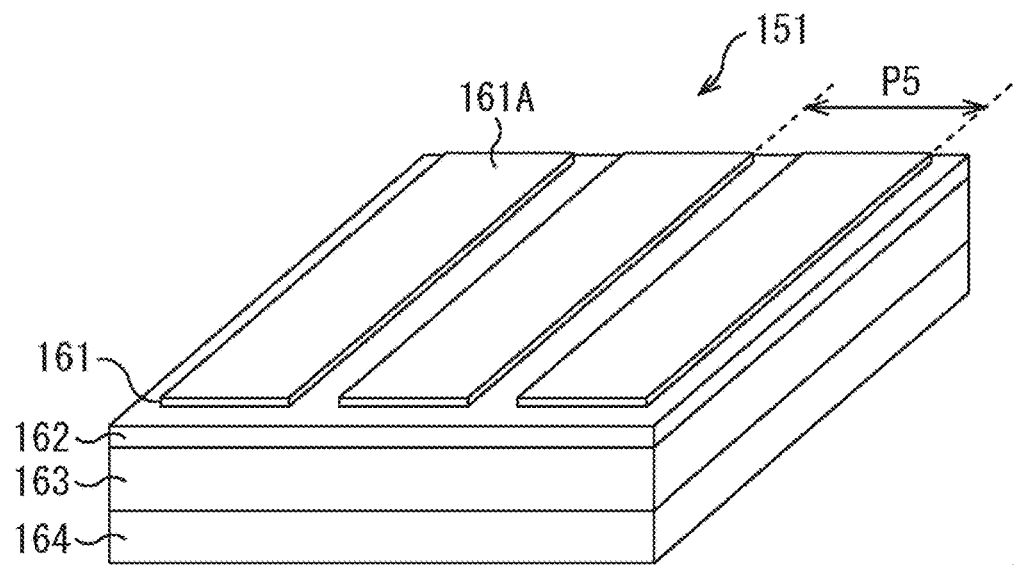
FIG. 14 is a diagram illustrating an exemplary configuration of a plasmon filter using GMR.

Further, the narrowband filter NB can employ a plasmon filter 151 using guided mode resonant (GMR) illustrated in FIG. 14.

A conductive layer 161, an SiO2 film 162, an SiN film 163, and an SiO2 substrate 164 are laminated from the top in the plasmon filter 151. The conductive layer 161 is included in the narrowband filter layer 103 of FIG. 3, for example, and the SiO2 film 162, the SiN film 163, and the SiO2 substrate 164 are included in the interlayer film 104 of FIG. 3, for example.

Rectangular conductive thin films 161A including aluminum, for example, are arranged at a predetermined pitch P5 on the conductive layer 161 such that the long sides of the conductive thin films 161A are adjacent. Then, the transmission band of the plasmon filter 151 changes due to the pitch P5 or the like.

Figure 15:
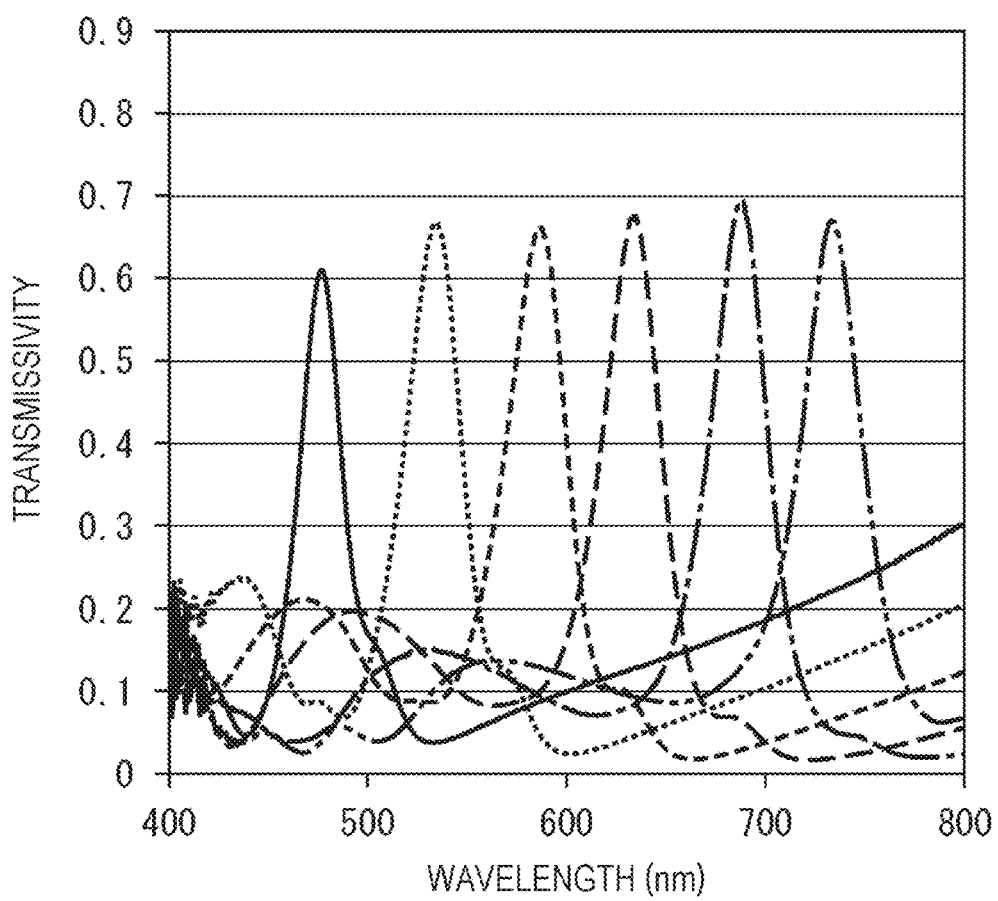
FIG. 15 is a graph illustrating exemplary spectroscopic characteristics of the plasmon filter using GMR.

FIG. 15 is a graph illustrating exemplary spectroscopic characteristics of the plasmon filter 151 in a case where the pitch P5 is changed. The horizontal axis in the graph indicates a wavelength (nm), and the vertical axis indicates a transmissivity. This example indicates exemplary spectroscopic characteristics in a case where the pitch P5 is changed in six kinds from 280 nm to 480 nm by 40 nm and the width of a slit between adjacent conductive thin films 161A is set at ¼ of the pitch P5. Further, a waveform with the shortest peak wavelength in the transmission band indicates spectroscopic characteristics in a case where the pitch P5 is set at 280 nm, and as the pitch P5 is wider, the peak wavelength is longer. That is, as the pitch P5 is narrower, the transmission band of the plasmon filter 151 shifts toward the shorter wavelength side, and as the pitch P5 is wider, the transmission band of the plasmon filter 151 shifts towards the longer wavelength side.

The plasmon filter 151 using GMR is also excellent in affinity with an organic material-based color filter similarly to the plasmon filters in the hole array structure and in the dot array structure.

<Second Embodiment of Imaging Device>

A second embodiment of the imaging device 12 of FIG. 1 will be described below with reference to FIG. 16 to FIG. 21.

Figure 16:
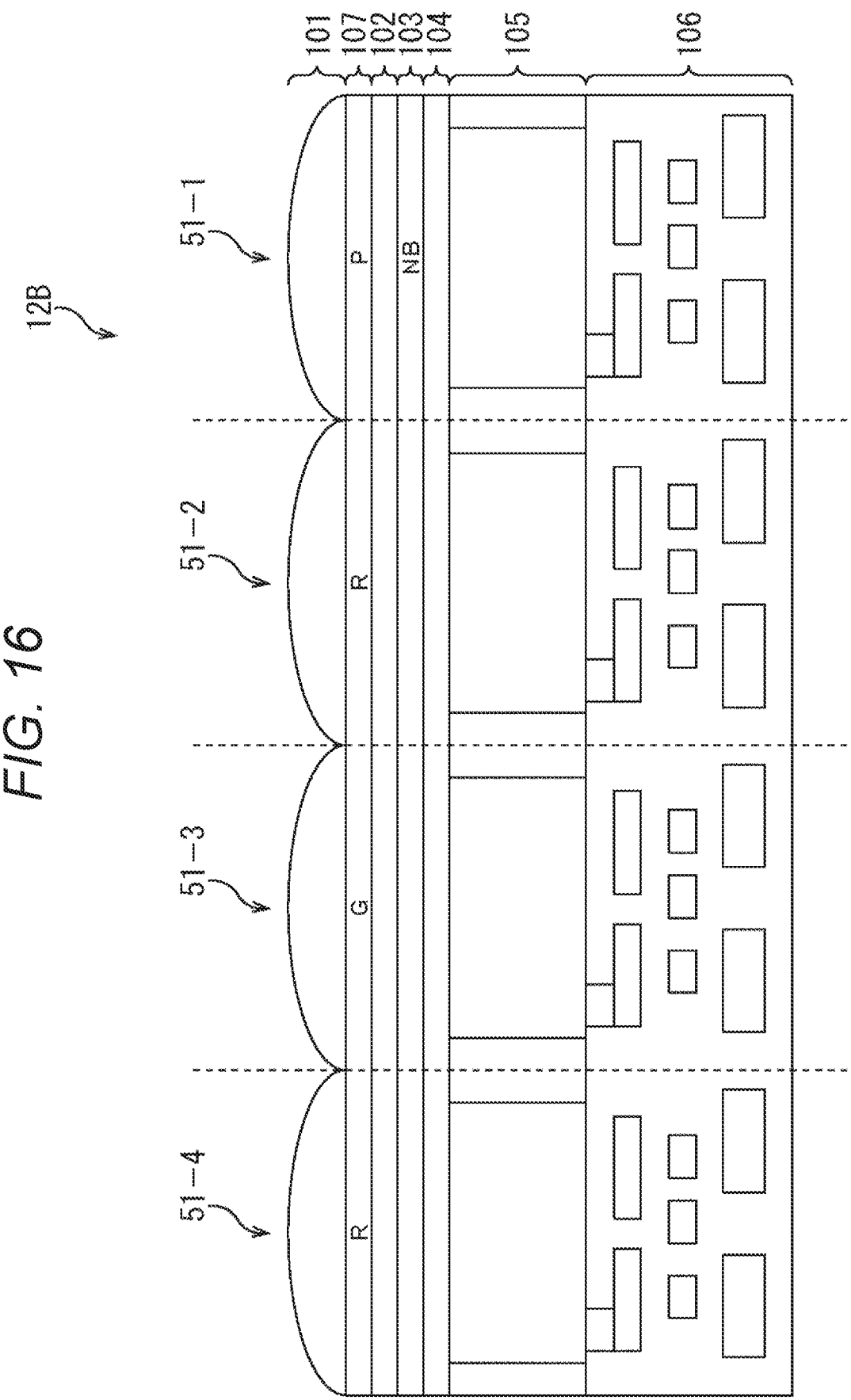
FIG. 16 is a cross-section view schematically illustrating an exemplary configuration of a second embodiment of the imaging device.

FIG. 16 schematically illustrates an exemplary cross-section configuration of an imaging device 12B as the second embodiment of the imaging device 12. Additionally, the parts corresponding to those in the imaging device 12A of FIG. 3 are denoted with the same reference numerals in the Figure, and the description thereof will be omitted as needed.

The imaging device 12B is different from the imaging device 12A in that a color filter layer 107 is laminated between the on-chip microlens 101 and the interlayer film 102.

The narrowband filters NB are provided not in all the pixels 51 but in some pixels 51 in the narrowband filter layer 103 in the imaging device 12B. The kinds of transmission bands (the number of bands) of the narrowband filter NB are arbitrary, and are set at 1 or more, for example.

Each pixel 51 is provided with a color filter in the color filter layer 107. For example, any of general red filter R, green filter G, and blue filter B (not illustrated) is provided in a pixel 51 which is not provided with the narrowband filter NB. Thereby, for example, R pixels provided with the red filter R, G pixels provided with the green filter G, B pixels provided with the blue filter, and MS pixels provided with the narrowband filter NB are arranged in the pixel array 31.

Further, a transmission filter P is provided in the color filter layer 107 in a pixel 51 provided with the narrowband filter NB. The transmission filter P is configured of an optical filter (low-pass filter, high-pass filter, or bandpass filter) for transmitting a light in a wavelength band including the transmission band of the narrowband filter NB of the same pixel 51.

Additionally, the color filter provided in the color filter layer 107 may be organic material based or inorganic material based.

An organic material-based color filter is dye/colorant based using synthetic resin or native protein, and pigment-containing based using pigment or dye, for example.

An inorganic material-based color filter employs a material such as TiO2, ZnS, SiN, MgF2, SiO2, Low-k, and the like. Further, an inorganic material-based color filter is formed in a method such as deposition, sputtering, chemical vapor deposition (CVD) film formation, or the like.

Further, the interlayer film 102 is set at a film thickness capable of preventing the color filter layer 107 from influencing the surface plasmon on the interface between the interlayer film 102 and the narrowband filter layer 103 as described above with reference to FIG. 9.

An occurrence of flares is restricted by the transmission filter P provided in the color filter layer 107. This point will be described with reference to FIG. 17 and FIG. 18.

Figure 17:
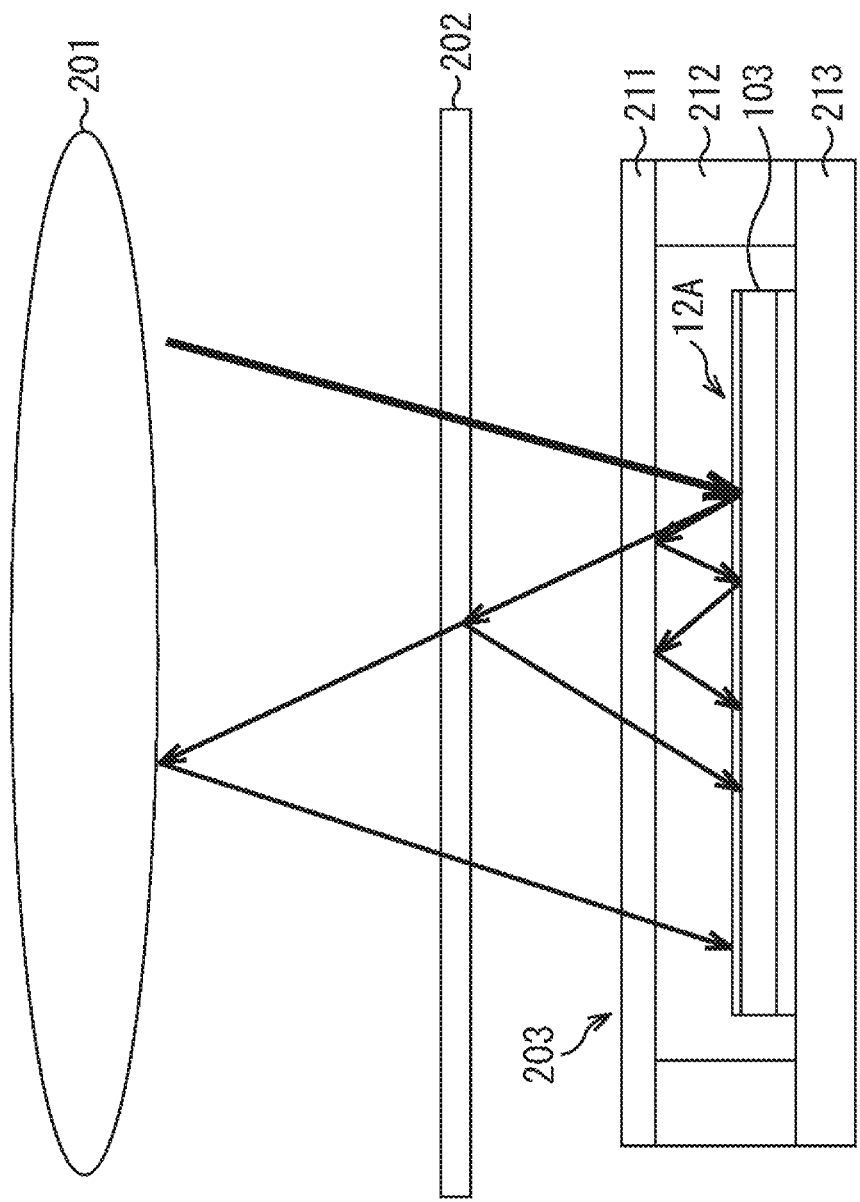
FIG. 17 is a diagram schematically illustrating how flares occur in the shooting apparatus.

FIG. 17 schematically illustrates how flares occur in the shooting apparatus 10 using the imaging device 12A of FIG. 2 not provided with the color filter layer 107.

In this example, the imaging device 12A is provided in a semiconductor chip 203. Specifically, the semiconductor chip 203 is mounted on a substrate 213, and its surrounding is covered with seal glass 211 and resin 212. Then, a light transmitting through a lens 201 and an IR cut filter 202 provided in the optical system 11 of FIG. 1 as well as the seal glass 211 is incident into the imaging device 12A.

Here, in a case where the narrowband filter NB in the narrowband filter layer 103 in the imaging device 12A is configured of a plasmon filter, a metallic conductive thin film is formed in the plasmon filter. The conductive thin film is high in its reflectivity, and thus easily reflects a light with a wavelength outside the transmission band. Then, part of a light reflected on the conductive thin film is reflected on the seal glass 211, the IR cut filter 202, or the lens 201, and is incident into the imaging device 12A again as illustrated in FIG. 17, for example. Flares occur due to the re-incident light. Particularly the plasmon filter in the hole array structure is low in its aperture, and thus flares easily occur.

The use of an antireflective film including a different metal from the conductive thin film or a high-dielectric material, for example, is considered in order to prevent the reflected light. However, the plasmon filter uses surface plasmon resonance, and if such an antireflective film contacts on the surface of the conductive thin film, the characteristics of the plasmon filter can be deteriorated or desired characteristics can be difficult to obtain.

Figure 18:
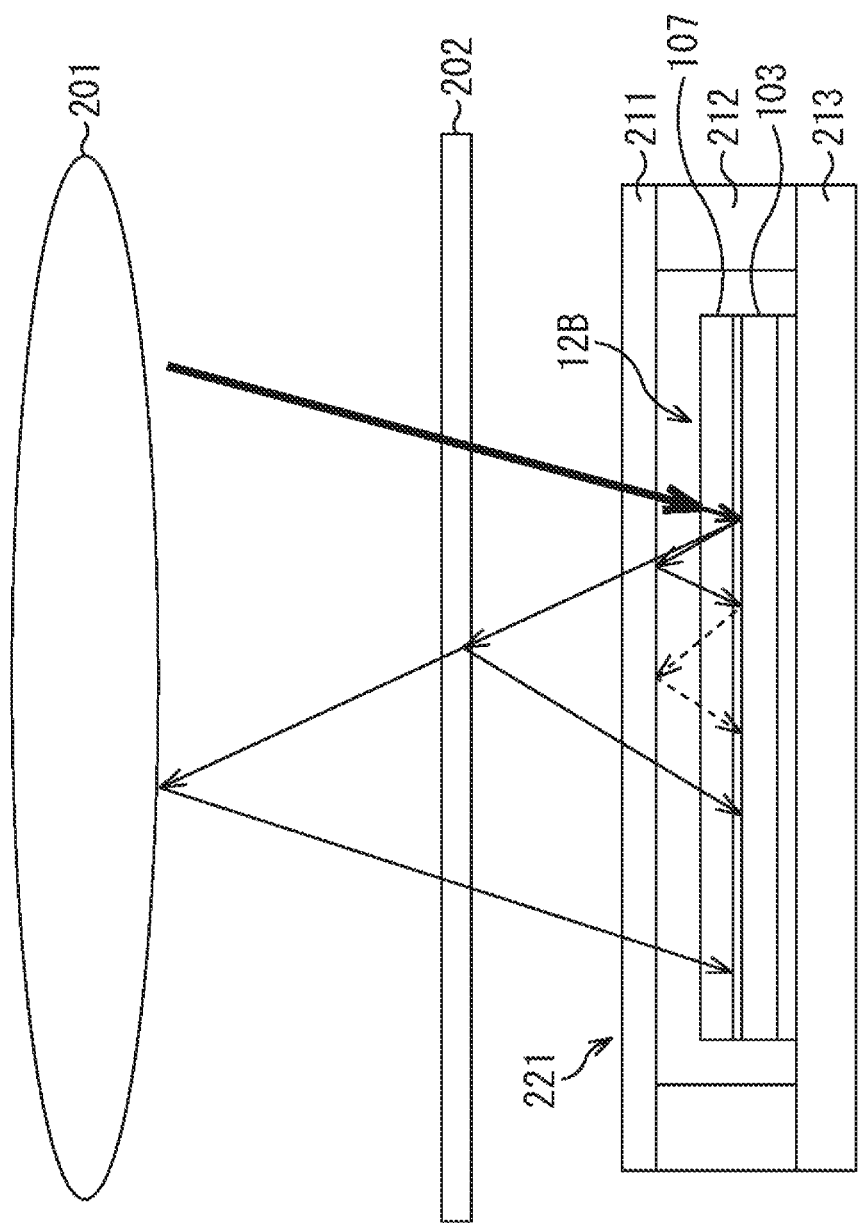
FIG. 18 is a diagram for explaining a method for reducing flares in the shooting apparatus.

On the other hand, FIG. 18 schematically illustrates how flares occur in the shooting apparatus 10 using the imaging device 12B of FIG. 16 provided with the color filter layer 107. Additionally, the parts corresponding to those in FIG. 17 are denoted with the same reference numerals in the Figure.

The example of FIG. 18 is different from the example of FIG. 17 in that a semiconductor chip 221 is provided instead of the semiconductor chip 203. The semiconductor chip 221 is different from the semiconductor chip 203 in that the imaging device 12B is provided instead of the imaging device 12A.

As described above, the transmission filter P is provided above the narrowband filter NB (toward the light incident side) in the imaging device 12B. Thus, a light incident into the imaging device 12B is cut off in its predetermined wavelength band by the transmission filter P and is then incident into the narrowband filter NB, and thus the amount of the incident light into the narrowband filter NB is restricted. Consequently, the amount of reflected light on the conductive thin film in the narrowband filter NB (plasmon filter) also reduces, and thus flares reduce.

Figure 19:
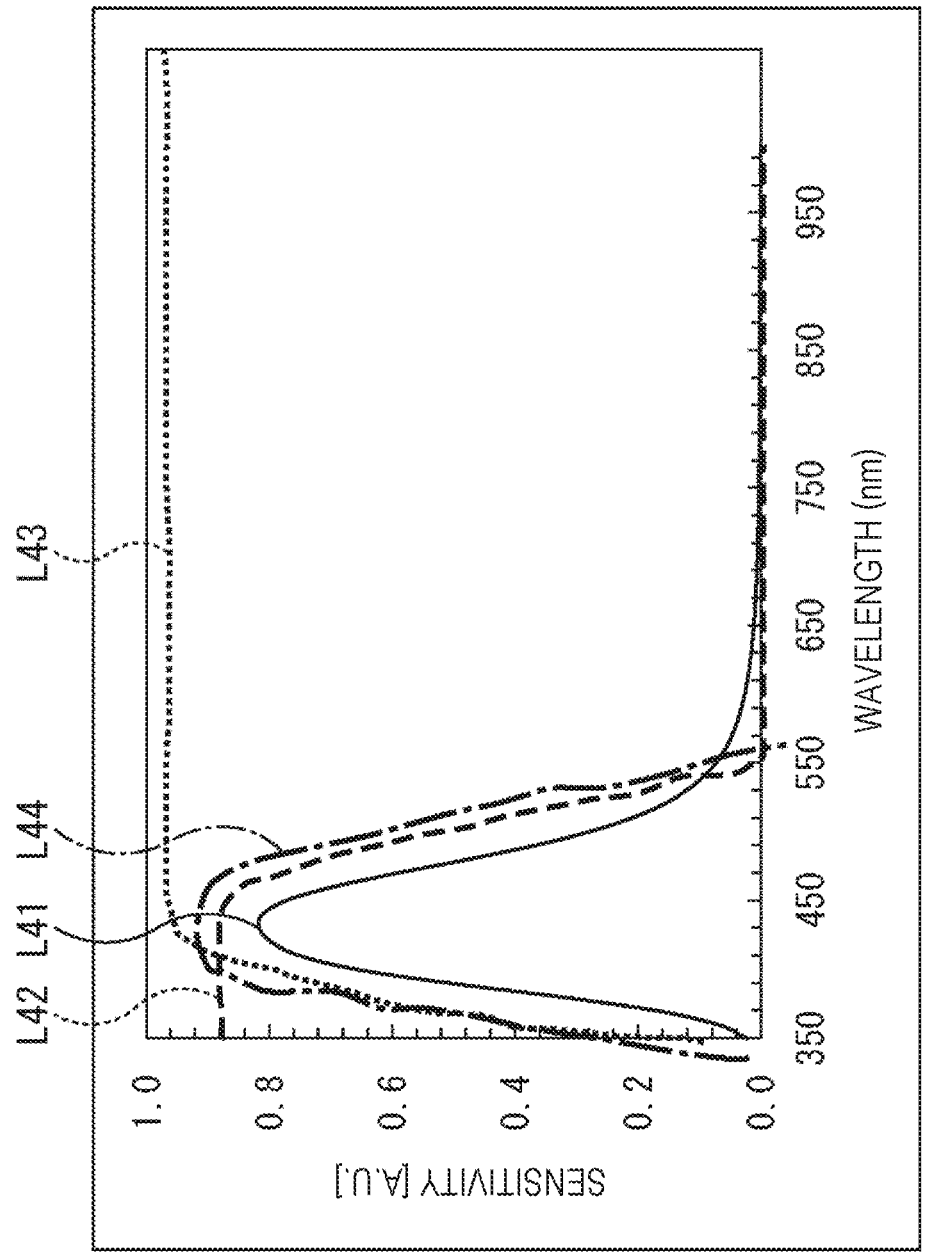
FIG. 19 is a graph illustrating a first example of spectroscopic characteristics of a narrowband filter and a transmission filter.
Figure 20:
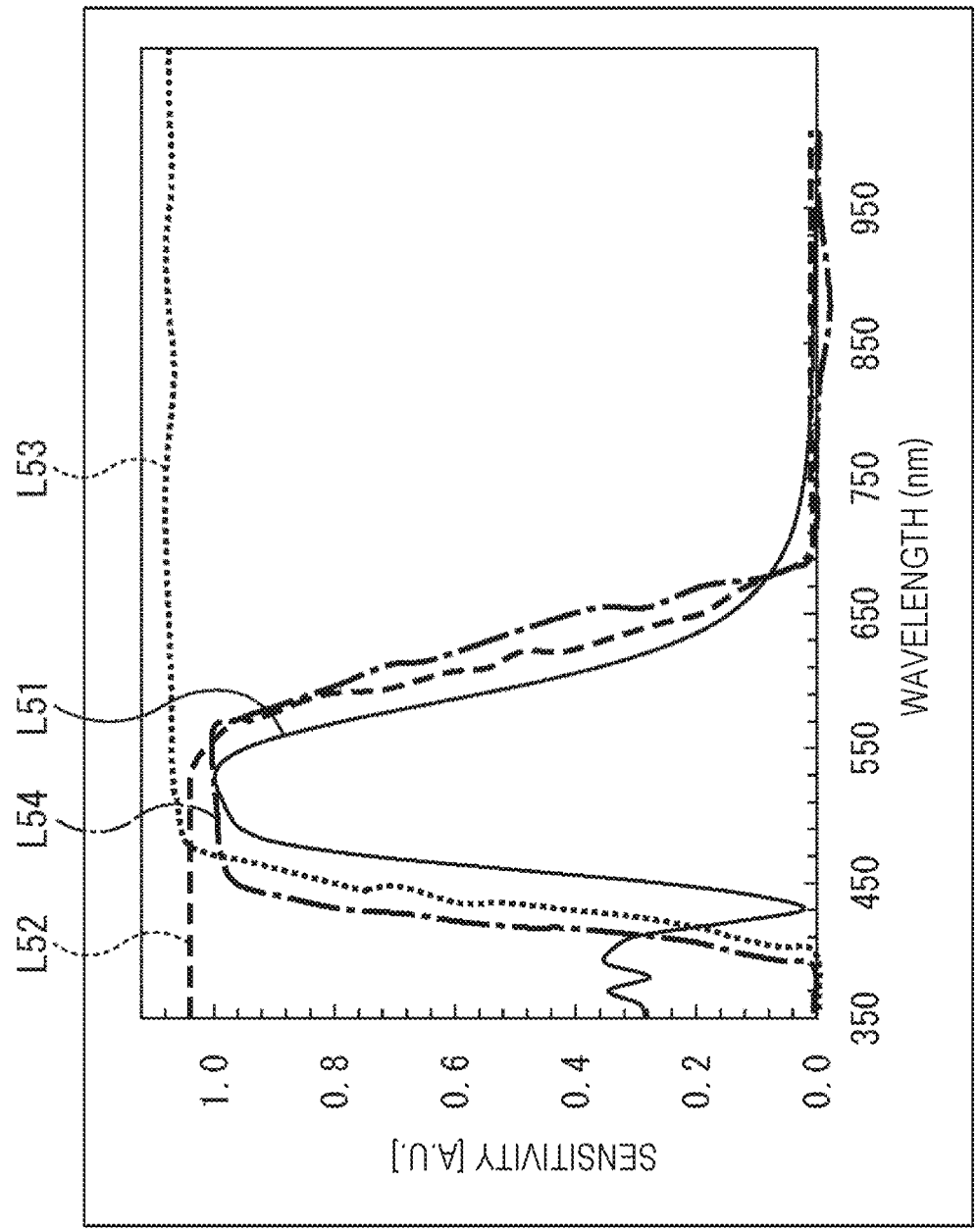
FIG. 20 is a graph illustrating a second example of the spectroscopic characteristics of the narrowband filter and the transmission filter.
Figure 21:
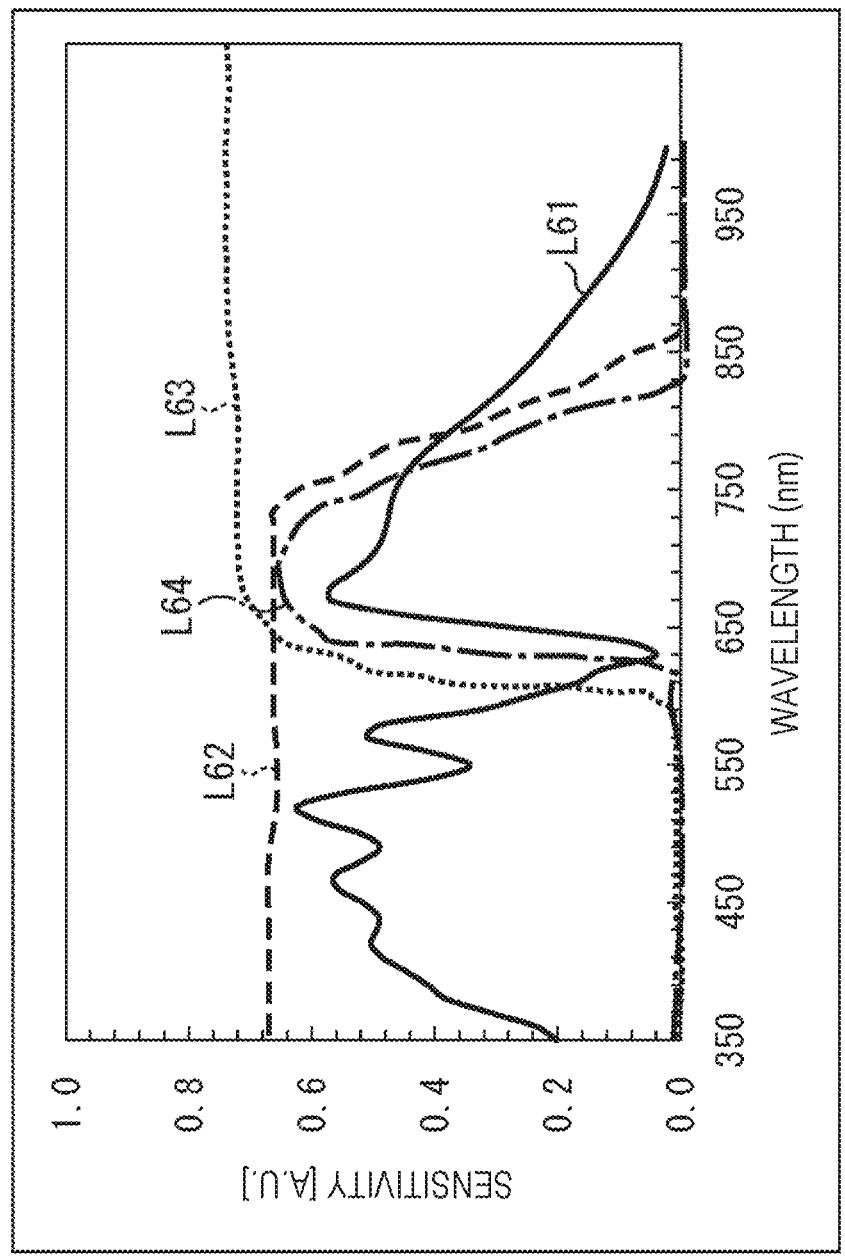
FIG. 21 is a graph illustrating a third example of the spectroscopic characteristics of the narrowband filter and the transmission filter.

FIG. 19 to FIG. 21 illustrate exemplary spectroscopic characteristics of the narrowband filter NB and exemplary spectroscopic characteristics of the transmission filter P arranged above the narrowband filter NB. Additionally, the horizontal axes in the graphs of FIG. 19 to FIG. 21 indicate a wavelength (nm), and the vertical axes indicate a sensitivity (arbitrary unit).

The line L41 in FIG. 19 indicates spectroscopic characteristics of the narrowband filter NB. The peak wavelength of the spectroscopic characteristics of the narrowband filter NB is around 430 nm. The line L42 indicates spectroscopic characteristics of the low-pass transmission filter P. The line L43 indicates spectroscopic characteristics of the high-pass transmission filter P. The line L44 indicates spectroscopic characteristics of the bandpass transmission filter P. The sensitivity of any transmission filter P is higher than the sensitivity of the narrowband filter NB in a predetermined wavelength band including the peak wavelength of the spectroscopic characteristics of the narrowband filter NB. Thus, even if any transmission filter P is used, the amount of incident light into the narrowband filter NB can be reduced without almost attenuating the light in the transmission band of the narrowband filter NB.

The line L51 of FIG. 20 indicates spectroscopic characteristics of the narrowband filter NB. The peak wavelength of the spectroscopic characteristics of the narrowband filter NB is around 530 nm. The line L52 indicates spectroscopic characteristics of the low-pass transmission filter P. The line L53 indicates spectroscopic characteristics of the high-pass transmission filter P. The line L54 indicates spectroscopic characteristics of the bandpass transmission filter P. The sensitivity of any transmission filter is higher than the sensitivity of the narrowband filter NB in a predetermined wavelength band including the peak wavelength of the spectroscopic characteristics of the narrowband filter NB. Thus, even if any transmission filter P is used, the amount of incident light into the narrowband filter NB can be reduced without almost attenuating the light in the transmission band of the narrowband filter NB.

The line L61 in FIG. 21 indicates spectroscopic characteristics of the narrowband filter NB. The peak wavelength of the spectroscopic characteristics of the narrowband filter NB in the plasmon mode is around 670 nm. The line L62 indicates spectroscopic characteristics of the low-pass transmission filter P. The line L63 indicates spectroscopic characteristics of the high-pass transmission filter P. The line L64 indicates spectroscopic characteristics of the bandpass transmission filter P. The sensitivity of any transmission filter P is higher than the sensitivity of the narrowband filter NB in a predetermined wavelength band including the peak wavelength in the plasmon mode of about 630 nm or more as a cutoff wavelength of the spectroscopic characteristics of the narrowband filter NB. Thus, even if any transmission filter P is used, the amount of incident light into the narrowband filter NB can be reduced without almost attenuating the light in the transmission band of the narrowband filter NB in the plasmon mode. However, the high-pass or bandpass transmission filter P can further cut off a light in the wavelength band of the narrowband filter NB in the waveguide mode, and thus is more desirable in the narrowband filter characteristics.

Additionally, in a case where the transmission band of the red filter R, the green filter G, or the blue filter B includes the transmission band of the narrowband filter NB in the lower layer, the filter may be used for the transmission filter P.

Further, the example of FIG. 16 illustrates that the narrowband filters NB are provided only in some pixels 51, but the narrowband filters NB can be provided in all the pixels 51. In this case, the transmission filter P having a transmission band including the transmission band of the narrowband filter NB in the pixel 51 may be provided for the color filter layer 107 per pixel 51.

Further, combinations of colors of the color filters in the color filter layer 107 are not limited to the above examples, and can be arbitrarily changed.

Further, in a case where a solution for flares is not required, for example, the transmission filter P may not be provided above the narrowband filter NB, or a dummy filter for transmitting lights with all the wavelengths may be provided.

<Third Embodiment of Imaging Device>

A third embodiment of the imaging device 12 of FIG. 1 will be described below with reference to FIG. 22.

Figure 22:
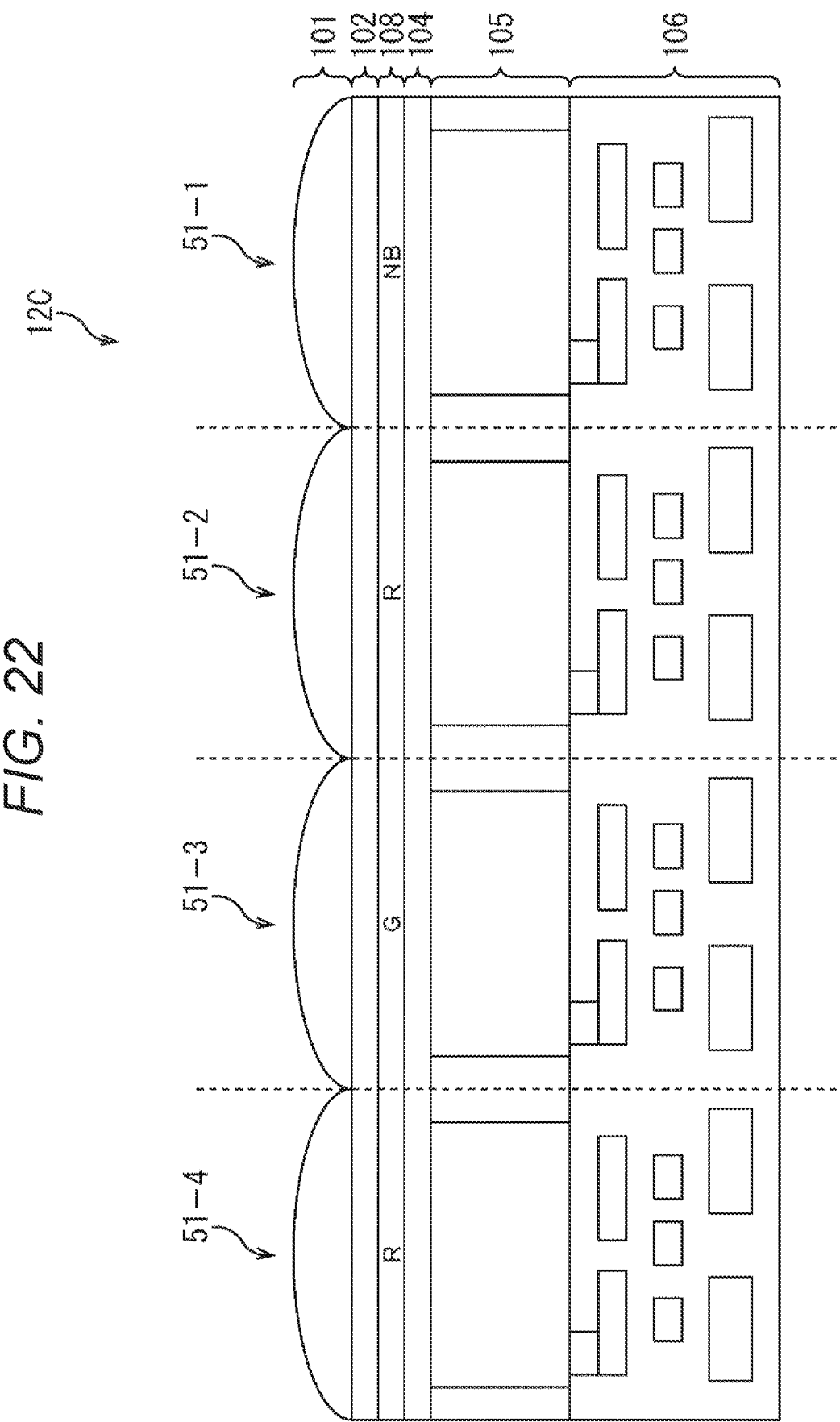
FIG. 22 is a cross-section view schematically illustrating an exemplary configuration of a third embodiment of the imaging device.

FIG. 22 schematically illustrates an exemplary cross-section configuration of an imaging device 12C as the third embodiment of the imaging device 12. Additionally, the parts corresponding to those in the imaging device 12A of FIG. 3 are denoted with the same reference numerals in the Figure, and the description thereof will be omitted as needed.

The imaging device 12C is different from the imaging device 12A in that a filter layer 108 is provided instead of the narrowband filter layer 103. Further, the imaging device 12C is different from the imaging device 12B of FIG. 16 in that the narrowband filter NB and the color filter (such as red filter R, green filter G, or blue filter B) are provided in the same filter layer 108.

Thereby, in a case where R pixels, G pixels, B pixels, and MS pixels are arranged in the pixel array 31 in the imaging device 12C, the color filter layer 107 can be omitted.

Additionally, in a case where an organic material-based color filter is used, the narrowband filter NB is earlier formed and a high-temperature final thermal processing such as sinter processing is performed, and then the color filter is formed in order to prevent a damage of the color filter due to heat, or the like, for example. On the other hand, in a case where an inorganic material-based color filter is used, the limitation of the above formation order is not basically required.

Further, in a case where a solution for flares is made as in the imaging device 12B of FIG. 16, a color filter layer may be laminated between the on-chip microlens 101 and the interlayer film 102 similarly to the imaging device 12B. In this case, the transmission filter P described above is provided in the color filter layer in the pixel 51 in which the filter layer 108 is provided with the narrowband filter NB. On the other hand, the color filter layer is not provided with a filter in the pixel 51 in which the filter layer 108 is provided with a color filter, or a dummy filter for transmitting lights with all the wavelengths or a color filter with the same color as the filter layer 108 is provided.

2. Second Embodiment

A second embodiment of the present technology will be described below with reference to FIG. 23 to FIG. 33.

Additionally, the second embodiment will be described assuming that an imaging device 12C of FIG. 22 is used for the imaging device 12 in the shooting apparatus 10.

Figure 23:
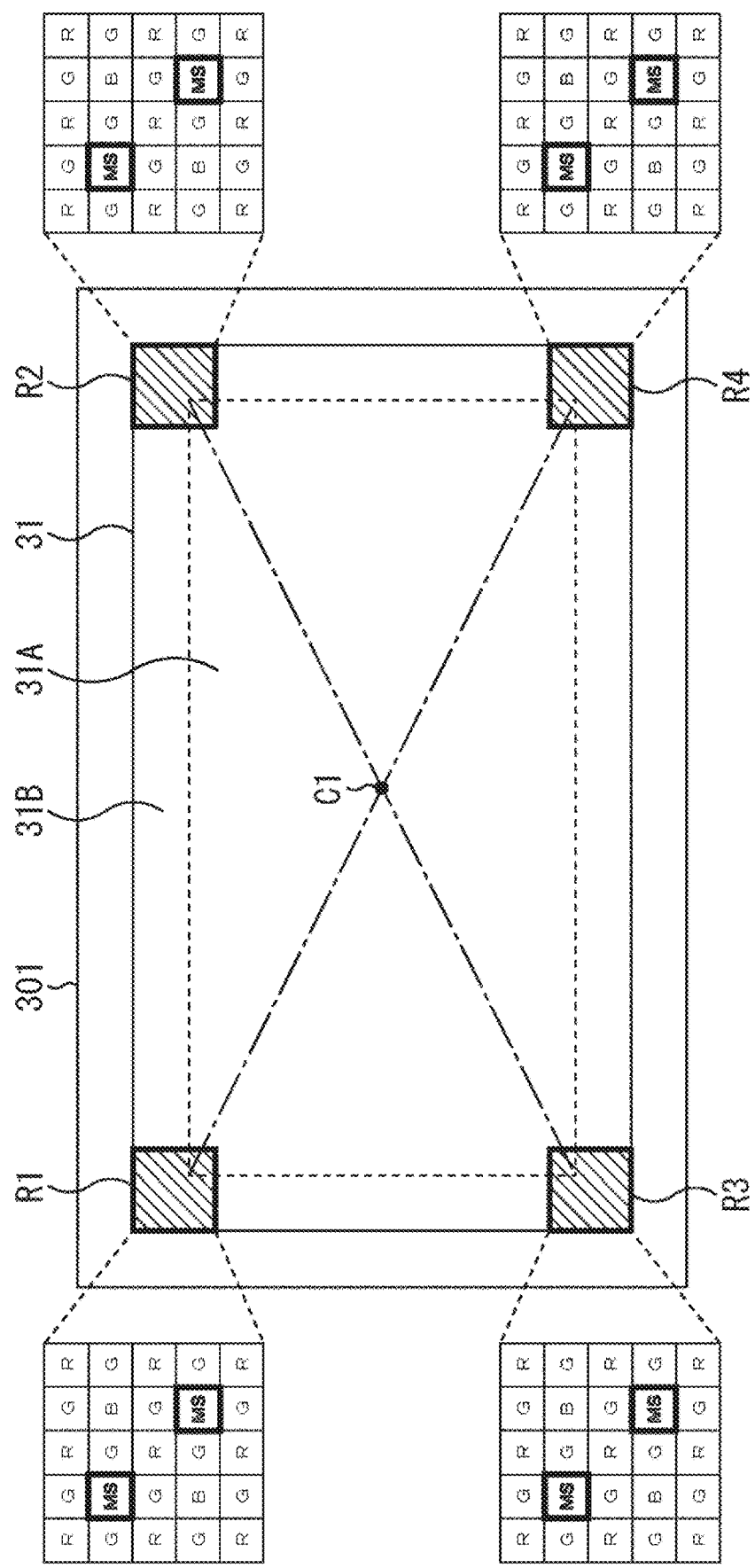
FIG. 23 is a diagram illustrating an exemplary configuration of the pixel array.

FIG. 23 illustrates an exemplary configuration of the pixel array 31 in the imaging device 12C.

The pixel array 31 is provided on a predetermined face of a semiconductor chip 301 including the imaging device 12C. The pixel array 31 is divided into an effective region 31A arranged at the center and a surrounding region 31B around the effective region 31A.

The effective region 31A is used for obtaining an image. For example, any of the red filter R, the green filter G, or the blue filter B for transmitting a light with a respective different wavelength is provided in each pixel 51 in the effective region 31A in the filter layer 108 of FIG. 22. Thereby, the R pixels provided with the red filter R, the G pixels provided with the green filter G, and the B pixels provided with the blue filter are arranged in the effective region 31A. Then, an image to be displayed is generated on the basis of a pixel signal output from each pixel 51 in the effective region 31A.

The surrounding region 31B is directed for obtaining more kinds of color spectrums than that of the effective region 31A, for example. For example, the narrowband filter NB is provided in each pixel 51 in the surrounding region 31B in the filter layer 108 of FIG. 22 in addition to the red filter R, the green filter G, or the blue filter B. Thereby, the multispectral pixels MS provided with the narrowband filter NB are arranged in the surrounding region 31B in addition to the R pixels, the G pixels, and the B pixels.

Additionally, two or more kinds of transmission bands of the narrowband filter NB are set as needed, not limited to one kind. Thus, two or more wavelength bands of lights detected by the multispectral pixels MS (denoted as detection band below) are set as needed.

Further, the pixel signals output from the multispectral pixels MS are used independently of the pixel signals output from the other pixels (such as the R pixels, the G pixels, and the B pixels) in the effective region 31A and the surrounding region 31B, for example. The former pixel signals and the latter pixel signals are used for mutual combination, interpolation, and the like, for example.

Narrowband lights in a desired wavelength band can be detected by the multispectral pixels MS arranged in the surrounding region 31B in this way. Further, a multispectral pixel MS is not provided in the effective region 31A, and thus a reduction in resolution of an image generated by the pixel signals in the effective region 31A is not caused.

Exemplary arrangements of the multispectral pixels MS will be described herein.

For example, the multispectral pixels MS are arranged substantially at the same image heights with reference to an image height center C1 of a lens (not illustrated) configuring the optical system 11 of FIG. 1, which almost matches with the center of the effective region 31A. For example, in the example of FIG. 23, the multispectral pixels MS are arranged to be symmetrical with respect to the image height center C1 in the region R1 at the upper left corner and in the region R4 at the lower right corner in the surrounding region 31B. Further, the multispectral pixels MS are arranged to be symmetrical with respect to the image height center C1 in the region R2 at the upper right corner and in the region R3 at the lower left corner in the surrounding region 31B.

Further, the narrowband filter NB with a similar transmission band is provided in the multispectral pixels MS with substantially the same image heights, for example. Thereby, the detection bands of the multispectral pixels MS with substantially the same image heights are equal. Further, spectroscopic characteristics of the lens aberration of the same wavelength band can be detected at the same image height in the surrounding region 31B, for example.

Further, the pixels 51, which have less influence on the accuracy of detecting the multispectral pixels MS, are arranged around the multispectral pixels MS except a case where the multispectral pixels MS in the same detection band are arranged.

For example, the pixels 51, which has the sensitivity equal to or lower than that of the multispectral pixels MS, are arranged around the multispectral pixels MS.

Figures 24, 25:
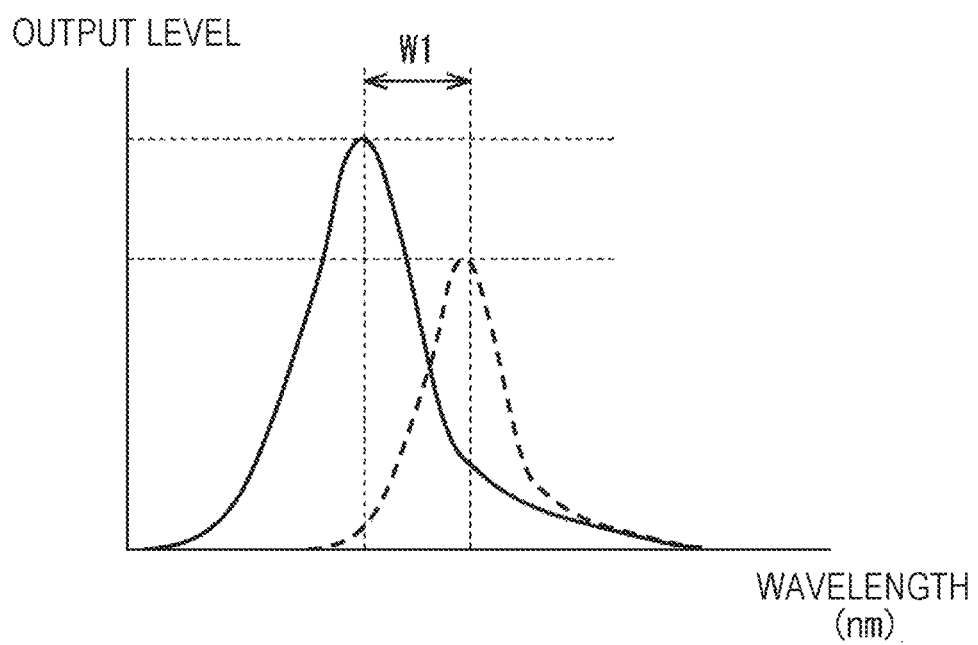
FIG. 24 is a diagram illustrating a first example of spectroscopic characteristics of multispectral pixels and surrounding pixels.
FIG. 25 is a diagram illustrating a first arrangement of pixels by way of example.

Specifically, FIG. 24 is a graph illustrating exemplary spectroscopic characteristics of multispectral pixels MS, and pixels 51 adjacent to the multispectral pixels MS in the vertical direction or in the horizontal direction (denoted as adjacent pixel below). The horizontal axis in the graph indicates a wavelength (nm), and the vertical axis indicates an output level. A waveform in a solid line indicates the spectroscopic characteristics of the multispectral pixels MS, and a waveform in a dotted line indicates the spectroscopic characteristics of the adjacent pixels.

The pixels 51, which has the sensitivity equal to or lower than that of the multispectral pixels MS, are arranged as adjacent pixels around the multispectral pixels MS like the adjacent pixels indicated in the graph. That is, an optical filter having the spectroscopic characteristics that the transmissivity is equal to or lower than that of the narrowband filter NB provided in the multispectral pixels MS is provided in the adjacent pixels, for example. More specifically, an optical filter having the spectroscopic characteristics that the transmissivity at the peak wavelength is equal to or lower than the transmissivity at the peak wavelength of the narrowband filter NB provided in the multispectral pixels MS is provided in the adjacent pixels, for example.

Thereby, the amount of light leaked from the adjacent pixels into the multispectral pixels MS can be reduced, and a deterioration in the spectroscopic characteristics of the multispectral pixels MS due to color mixture, attenuation, or the like, and a reduction in accuracy of detecting a narrowband light can be restricted, for example.

For example, the green filter G is higher in transmissivity than the red filter R and the blue filter G. Therefore, the G pixel is higher in sensitivity than the R pixel and the B pixel, and has a higher output level for the same incident light. Thus, an arrangement of the R pixels or B pixels adjacent to the multispectral pixels MS in the vertical direction and in the horizontal direction as illustrated in FIG. 26 is more desirable than an arrangement of the G pixels adjacent to the multispectral pixels MS in the vertical direction and in the horizontal direction as illustrated in FIG. 25, for example.

Additionally, it is desirable that a wavelength difference (denoted as peak wavelength difference below) W1 (FIG. 24) between the peak wavelength of the multispectral pixels MS and the peak wavelength of the adjacent pixels be larger.

Further, the pixels 51 with a large difference in detection band from the multispectral pixels MS are arranged around the multispectral pixels MS, for example.

Specifically, FIG. 27 is a graph illustrating exemplary spectroscopic characteristics of multispectral pixels MS and adjacent pixels similarly to FIG. 24.

For example, the pixels 51 having a difference in detection band from the multispectral pixels MS of a predetermined wavelength or more are arranged as adjacent pixels around the multispectral pixels MS as in this example. That is, an optical filter having the spectroscopic characteristics that a difference in transmission band from the narrowband filter NB provided in the multispectral pixels MS is a predetermined wavelength or more is provided in the adjacent pixels, for example.

More specifically, the pixels 51 having a peak wavelength difference W2 from the multispectral pixels MS of a predetermined wavelength or more are arranged as adjacent pixels around the multispectral pixels MS. That is, an optical filter having the spectroscopic characteristics that a difference in peak wavelength from the narrowband filter NB provided in the multispectral pixels MS is a predetermined wavelength or more (20 nm or more, for example) is provided in the adjacent pixels, for example.

Thereby, the amount of light leaked from the adjacent pixels in the range of the detection band of the multispectral pixels MS can be reduced, and a deterioration in the spectroscopic characteristics of the multispectral pixels MS due to color mixture, attenuation, or the like and a reduction in accuracy of detecting a narrowband light can be restricted, for example.

Further, in a case where the detection bands of the multispectral pixels MS and the adjacent pixels are close to each other, for example, the pixels 51, which has the lower sensitivity than that of the multispectral pixel and has as large difference in sensitivity as possible, are used as adjacent pixels.

Figure 28:
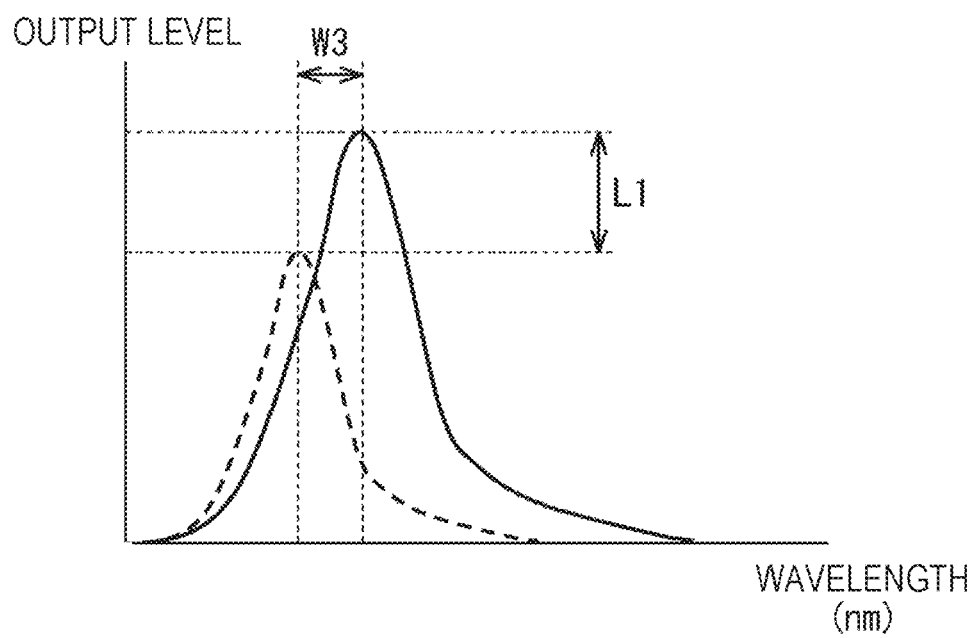
FIG. 28 is a diagram illustrating a third example of spectroscopic characteristics of multispectral pixels and surrounding pixels.
Figure 29:
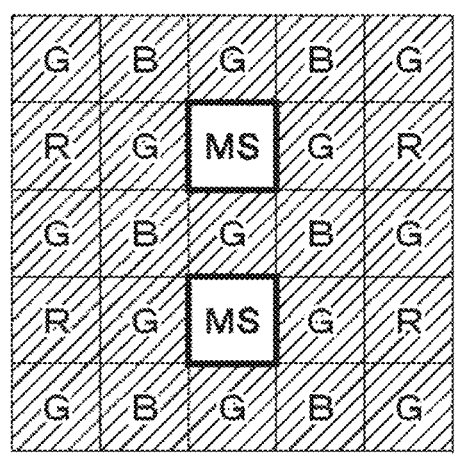
FIG. 29 is a diagram illustrating a third arrangement of pixels by way of example.

Specifically, FIG. 28 is a graph illustrating exemplary spectroscopic characteristics of multispectral pixels MS and adjacent pixels similarly to FIG. 24 and FIG. 27.

In a case where a peak wavelength difference W3 between the multispectral pixels MS and the adjacent pixels is less than a predetermined wavelength, the pixels 51, for which a difference L1 between an output level at the peak wavelength of the multispectral pixels MS and an output level at the peak wavelength of the adjacent pixels is a predetermined threshold or more, are used as adjacent pixels. That is, an optical filter having the spectroscopic characteristics that the transmissivity at the peak wavelength is lower than the transmissivity at the peak wavelength of the narrowband filter NB provided in the multispectral pixels MS and the difference therebetween is a predetermined threshold or more is provided in the adjacent pixels, for example. Thereby, the amount of light leaked from the adjacent pixels into the multispectral pixels MS can be reduced, and a deterioration in the spectroscopic characteristics of the multispectral pixels MS due to color mixture, attenuation, or the like, and a reduction in accuracy of detecting a narrowband light can be restricted, for example.

Additionally, the optical filter provided in the adjacent pixels may be any of the red filter R, the green filter G, and the blue filter G provided in the pixels 51 in the effective region 31A, or may be another optical filter. The other optical filter may be a color filter for transmitting a light with a color other than red, green, and blue, or a narrowband filter NB having a different transmission band from the narrowband filter NB provided in the multispectral pixels MS, for example. In the latter case, the multispectral pixels MS with different detection bands are adjacent.

Further, all the pixels 51 adjacent to the multispectral pixels MS do not necessarily need to meet any condition described above, and only some pixels 51 may meet any condition described above. Also when only some pixels 51 meet any condition described above, a reduction in accuracy of detecting a narrowband light of the multispectral pixels MS can be restricted.

Further, a light shield film is provided on the light incident side of each pixel 51 in the surrounding region 31B, for example, and an optical black region may be provided. In this case, the light shield film is provided in the pixels 51 around the multispectral pixels MS as shaded in FIG. 29, while the light shield film is not provided in the multispectral pixels MS.

Thereby, the amount of light leaked from the adjacent pixels into the multispectral pixels MS can be reduced, and a deterioration in the spectroscopic characteristics of the multispectral pixels MS due to color mixture, attenuation, or the like, and a reduction in accuracy of detecting a narrowband light can be restricted.

A density of multispectral pixels MS will be described below with reference to FIG. 30 to FIG. 33.

Figures 30, 31:
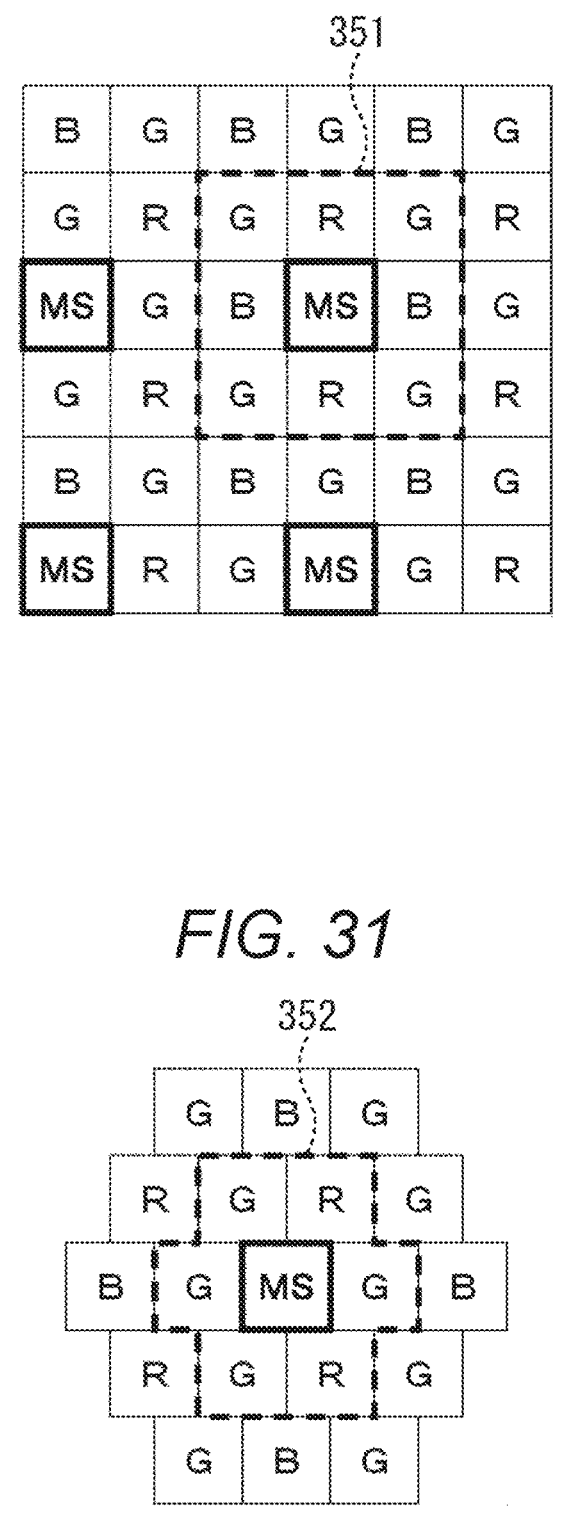

FIG. 30 illustrates an example in a case where the density of multispectral pixels MS is at 1/9 pixel. That is, one multispectral pixel MS is arranged at the center of a pixel block 351 configured of nine pixels 51 in three rows by three columns surrounded in a dotted line.

FIG. 31 illustrates an example in a case where the density of multispectral pixels MS is at 1/7 pixel. That is, one multispectral pixel MS is arranged at the center of a pixel block 352 configured of seven pixels 51 surrounded in a dotted line. Additionally, two pixels 51 are vertically adjacent to each side of the multispectral pixel MS in this example.

FIG. 32 illustrates an example in a case where the density of multispectral pixels MS is at 1/6 pixel. That is, two multispectral pixels MS are horizontally arranged side by side at the center of a pixel block 353 configured of 12 pixels in three rows by four columns surrounded in a dotted line.

FIG. 33 illustrates an example in a case where the density of multispectral pixels MS is at 1/4 pixel. That is, four multispectral pixels MS are arranged in two rows by two columns at the center of a pixel block 354 configured of 16 pixels in four rows by four columns surrounded in a dotted line.

3. Variants

Variants of the embodiments of the present technology described above will be described below.

For example, the imaging device 12B of FIG. 16 can be used in the second embodiment. That is, the color filter and the narrowband filter NB may be provided in different layers, for example.

Further, the exemplary pixel arrangements in the surrounding region 31B described above are exemplary, and another pixel arrangement can be employed. However, it is desirable that the narrowband filters NB with the same transmission band be provided for the pixels with the same image height. Further, it is desirable that pixels adjacent to multispectral pixels MS meet as many conditions described above as possible.

Further, the surrounding region 31B does not necessarily need to be provided in four directions of the effective region 31A, and may be provided in one direction to three directions of the effective region 31A.

Further, the transmission band of the optical filter (such as color filter, narrowband filter, and the like) used for the present technology is not necessarily limited to the wavelength band of a visible ray, and an optical filter for transmitting an ultraviolet ray or infrared ray can be used, for example.

In addition, the present technology can be applied to not only the CMOS image sensor of backside irradiation type described above but also other imaging devices using a plasmon filter. For example, the present technology can be applied to CMOS image sensors of surface irradiation type; charge coupled device (CCD) image sensors; image sensors in a photoconductor structure including organic photoelectric conversion film, quantum dot structure, or the like; and the like.

Figure 34:
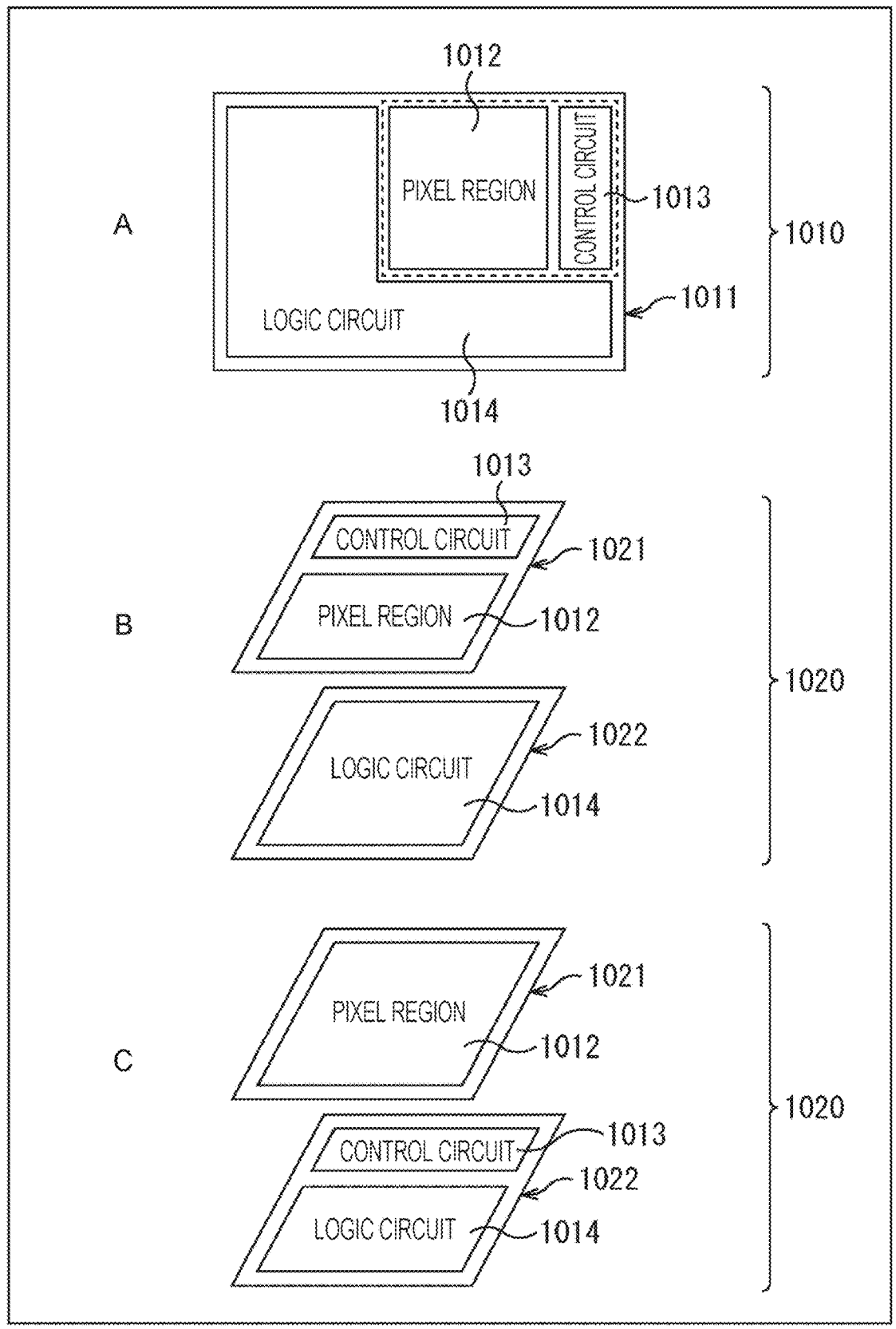
FIG. 34 is diagrams illustrating an outline of exemplary configurations of a solid-state shooting apparatus of laminated type to which the present technology can be applied.

Further, the present technology can be applied to a solid-state shooting apparatus of laminated type illustrated in FIG. 34, for example.

A of FIG. 34 illustrates an exemplary schematic configuration of a solid-state shooting apparatus of non-laminated type. As illustrated in A of FIG. 34, a solid-state shooting apparatus 1010 has a die (semiconductor substrate) 1011. The die 1011 mounts a pixel region 1012 in which pixels are arranged in an array shape, a control circuit 1013 for performing various controls in addition to driving pixels, and a logic circuit 1014 for performing signal processing.

B of FIG. 34 and C of FIG. 34 illustrate exemplary schematic configurations of a solid-state shooting apparatus of laminated type. A solid-state shooting apparatus 1020 is configured as one semiconductor chip in which two dies including a sensor die 1021 and a logic die 1022 are laminated and electrically connected as illustrated in B of FIG. 34 and C of FIG. 34.

In B of FIG. 34, the sensor die 1021 is mounted with the pixel region 1012 and the control circuit 1013, and the logic die 1022 is mounted with the logic circuit 1014 including a signal processing circuit for performing signal processing.

In C of FIG. 34, the sensor die 1021 mounts the pixel region 1012 thereon, and the logic die 1024 mounts the control circuit 1013 and the logic circuit 1014 thereon.

Further, the present technology can be applied to an imaging device using a narrowband filter such as metallic thin film filter other than plasmon filter. Further, such a narrowband filter may be an optical filter applying photonic crystal using a semiconductor material.

4. Applications

Applications of the present technology will be described below.

<Applications of Present Technology>

Figure 35:
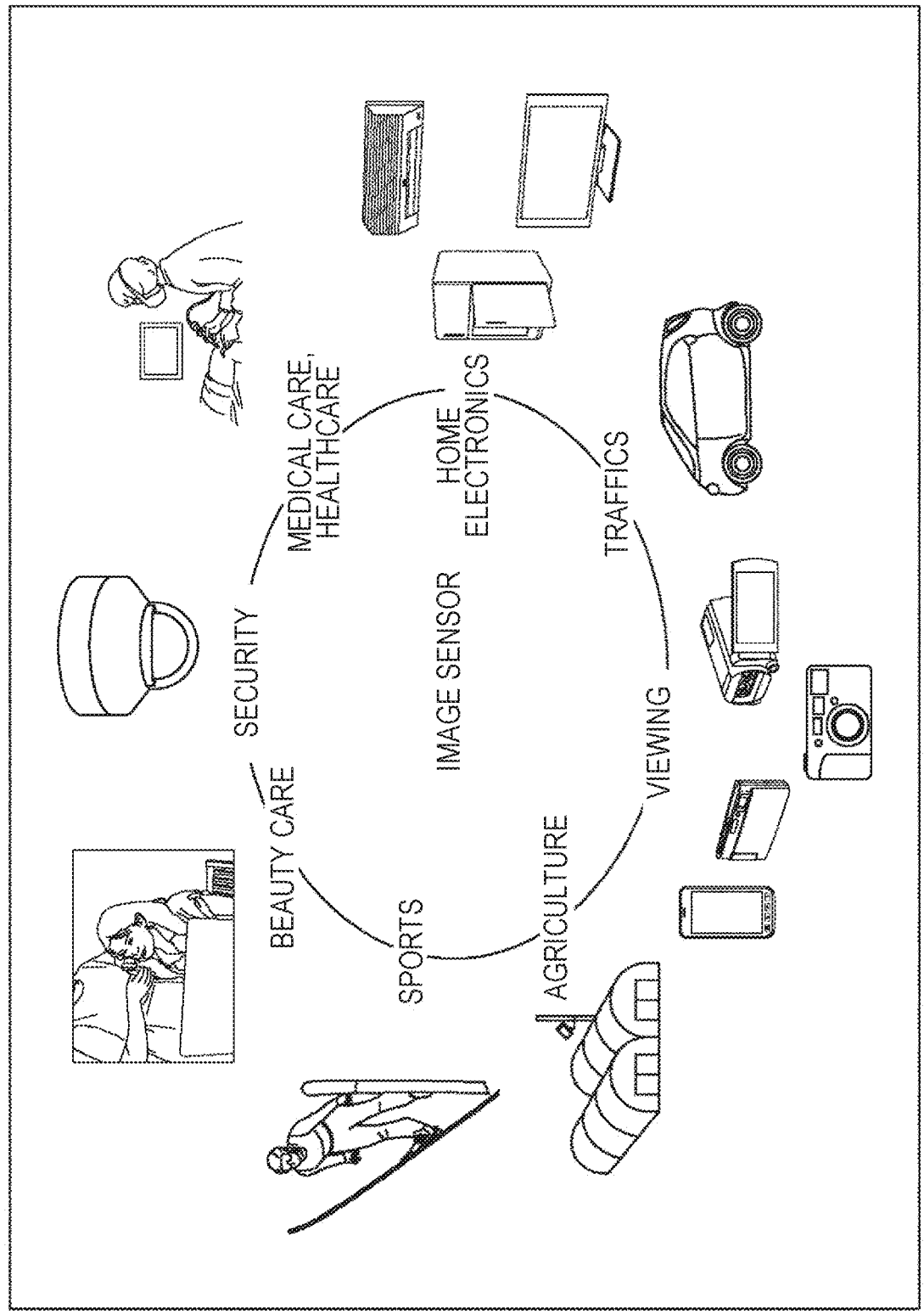
FIG. 35 is a diagram illustrating applications of the present technology.

The present technology can be applied in various cases for sensing a ray such as visible ray, infrared ray, ultraviolet ray, or X ray as illustrated in FIG. 35, for example.

- Apparatuses for shooting images to be viewed such as digital camera or portable apparatus with camera function
- Traffic apparatuses for safe driving such as automatic stop, or recognition of driver's state, for example, such as vehicle-mounted sensor for shooting in front of, behind, around, inside an automobile, or the like, monitoring camera for monitoring traveling vehicle or road, or distance measuring sensor for measuring inter-vehicle distance or the like
- Home electronics such as TV, refrigerator, and air conditioner for shooting user's gesture and performing a device operation according to the gesture
- Medical-care or healthcare apparatuses such as endoscope, or apparatus for performing angiography by received infrared ray
- Security apparatus such as monitoring camera for crime prevention, or camera for person authentication
- Beauty care apparatuses such as skin measurement device for shooting the skin, or microscope for shooting the scalp
- Sports apparatuses such as action camera or wearable camera for sports or the like
- Agricultural apparatus such as camera for monitoring state of field or crops More specific applications will be described below.

For example, the transmission band of the narrowband filter NB of each pixel 51 in the shooting apparatus 10 of FIG. 1 is adjusted thereby to adjust the wavelength band (detection band) of a light detected by each pixel 51 in the shooting apparatus 10. Then, the detection band of each pixel 51 is appropriately set so that the shooting apparatus 10 can be applied in various cases.

For example, FIG. 36 illustrates exemplary detection bands in a case where umami or freshness of food is detected.

For example, the peak wavelength of the detection band is in a range of 580 to 630 nm and the half bandwidth is in a range of 30 to 50 nm in a case where myoglobin indicating umami of tuna, beef, or the like is detected. The peak wavelength of the detection band is 980 nm and the half bandwidth is in a range of 50 to 100 nm in a case where oleic acid indicating freshness of tuna, beef, or the like is detected. The peak wavelength of the detection band is in a range of 650 to 700 nm and the half bandwidth is in a range of 50 to 100 nm in a case where chlorophyll indicating freshness of leaf vegetable such as *Brassica rapa* is detected.

FIG. 37 illustrates exemplary detection bands in a case where sugar content or water of a fruit is detected.

For example, the peak wavelength of the detection band is 880 nm and the half bandwidth is in a range of 20 to 30 nm in a case where a pulp optical path length indicating sugar content of raiden as a kind of melon is detected. The peak wavelength of the detection band is 910 nm and the half bandwidth is in a range of 40 to 50 nm in a case where sucrose indicating sugar content of raiden is detected. The peak wavelength of the detection band is 915 nm and the half bandwidth is in a range of 40 to 50 nm in a case where sucrose indicating sugar content of raiden red as another kind of melon is detected. The peak wavelength of the detection band is 955 nm and the half bandwidth is in a range of 20 to 30 nm in a case where water indicating sugar content of raiden red is detected.

The peak wavelength of the detection band is 912 nm and the half bandwidth is in a range of 40 to 50 nm in a case where sucrose indicating sugar content of apple is detected. The peak wavelength of the detection band is 844 nm and the half bandwidth is 30 nm in a case where water of mandarin orange is detected. The peak wavelength of the detection band is 914 nm and the half bandwidth is in a range of 40 to 50 nm in a case where sucrose indicating sugar content of mandarin orange is detected.

FIG. 38 illustrates exemplary detection bands in a case where plastics are classified.

For example, the peak wavelength of the detection band is 1669 nm and the half bandwidth is in a range of 30 to 50 nm in a case where poly ethylene terephthalate (PET) is detected. The peak wavelength of the detection band is 1688 nm and the half bandwidth is in a range of 30 to 50 nm in a case where poly styrene (PS) is detected. The peak wavelength of the detection band is 1735 nm and the half bandwidth is in a range of 30 to 50 nm in a case where poly ethylene (PE) is detected. The peak wavelength of the detection band is in a range of 1716 to 1726 nm and the half bandwidth is in a range of 30 to 50 nm in a case where poly vinyl chloride (PVC) is detected. The peak wavelength of the detection band is in a range of 1716 to 1735 nm and the half bandwidth is in a range of 30 to 50 nm in a case where polypropylene (PP) is detected.

Further, the present technology can be applied to manage freshness of cut flowers, for example.

Further, the present technology can be applied to inspect a foreign material mixed into food, for example. The present technology can be applied to detect a foreign material such as peel, shell, stone, leaf, branch, and piece of wood mixed into nuts such as almond, blueberry, and walnut, fruits, and the like, for example. Further, the present technology can be applied to detect a foreign material such as plastic piece mixed into processed food, beverage, and the like, for example.

Further, the present technology can be applied to detect normalized difference vegetation index (NDVI) as an index of vegetation, for example.

Further, the present technology can be applied to detect a person on the basis of one or both of a spectroscopic shape at a wavelength of around 580 nm derived from hemoglobin of human skin and a spectroscopic shape at a wavelength of around 960 nm derived from melanin pigment included in human skin, for example.

Further, the present technology can be applied for biometric sensing (biometric authentication), user interface, prevention of falsification of sign and the like, monitoring, and the like, for example.

<Application to Endoscopic Surgery System>

Further, the technology according to the present disclosure (the present technology) may be applied to an endoscopic surgery system, for example.

Figure 39:
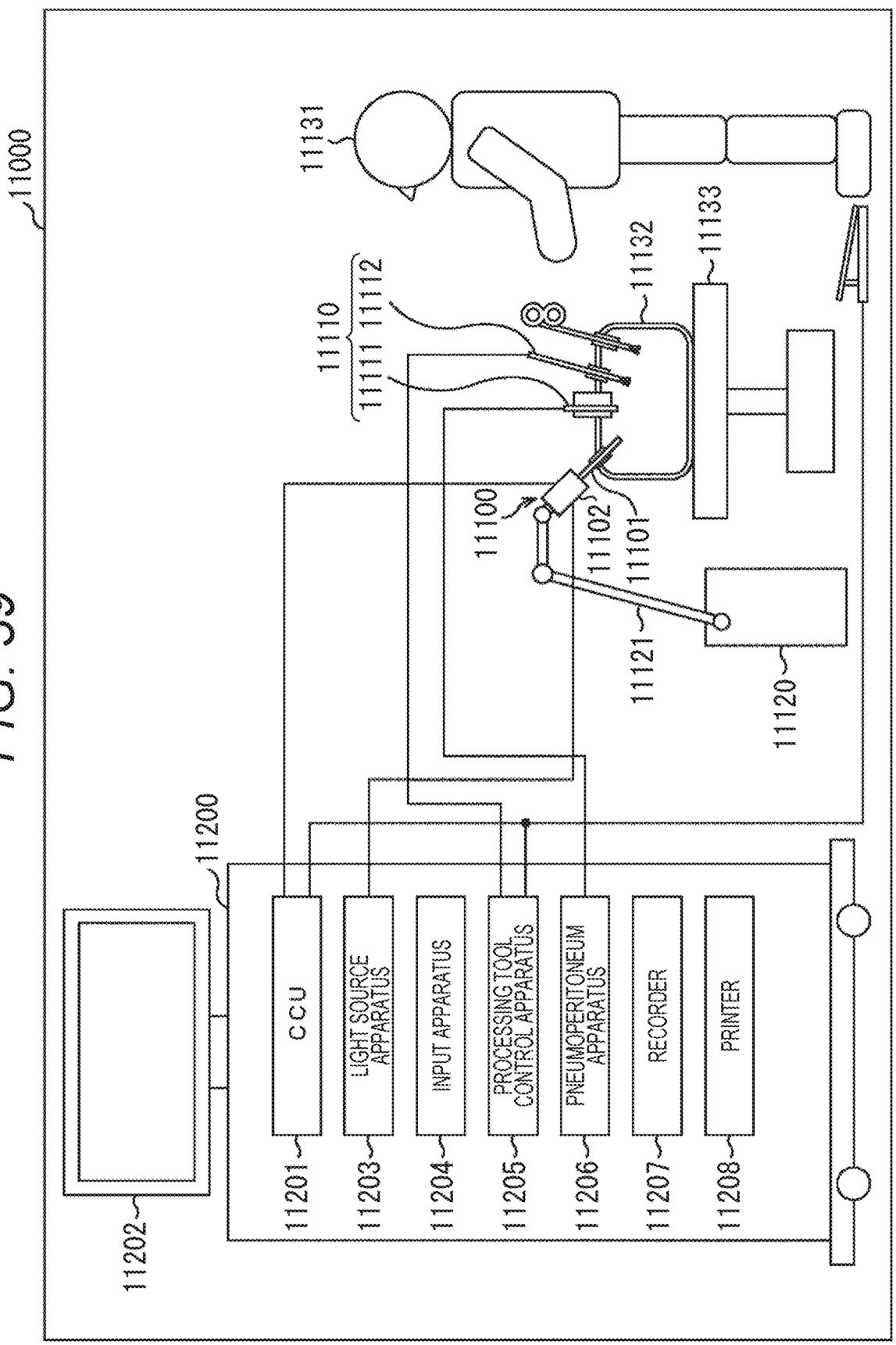
FIG. 39 is a diagram illustrating an exemplary schematic configuration of an endoscopic surgery system.

FIG. 39 is a diagram illustrating an exemplary schematic configuration of an endoscopic surgery system to which the technology according to the present disclosure (the present technology) can be applied.

FIG. 39 illustrates how an operator (doctor) 11131 performs an operation on a patient 11132 on a patient's bed 11133 by use of an endoscopic surgery system 11000. As illustrated, the endoscopic surgery system 11000 is configured of an endoscope 11100, the other surgical instruments 11110 such as pneumoperitoneum tube 11111 and energy treatment tool 11112, a support arm apparatus 11120 for supporting the endoscope 11100, and a cart 11200 on which various apparatuses for endoscopic surgery are mounted.

The endoscope 11100 is configured of a lens tube 11101 the region of which at a predetermined length from the tip is inserted into the body cavity of the patient 11132, and a camera head 11102 connected to the base of the lens tube 11101. In the illustrated example, the endoscope 11100 configured as a rigid scope having the hard lens tube 11101 is illustrated, but the endoscope 11100 may be configured as a flexible scope having a flexible lens tube.

An opening with an objective lens fitted is provided at the tip of the lens tube 11101. A light source apparatus 11203 is connected to the endoscope 11100, and a light generated by the light source apparatus 11203 is guided to the tip of the lens tube by a light guide extending into the lens tube 11101, and is irradiated toward an object to be observed in the body cavity of the patient 11132 via the objective lens. Additionally, the endoscope 11100 may be a direct-viewing lens, or may be an oblique-viewing lens or side-viewing lens.

An optical system and an imaging device are provided inside the camera head 11102, and a reflected light (observation light) from an object to be observed is condensed on the imaging device via the optical system. The observation light is photoelectrically converted by the imaging device, and an electric signal corresponding to the observation light, or an image signal corresponding to the observed image is generated. The image signal is transmitted as RAW data to a camera control unit (CCU) 11201.

The CCU 11201 is configured of a central processing unit (CPU), a graphics processing unit (GPU), or the like, and totally controls the operations of the endoscope 11100 and a display apparatus 11202. Further, the CCU 11201 receives an image signal from the camera head 11102, and performs various image processing for displaying an image based on the image signal, such as development processing (demosaic processing) or the like, on the image signal.

The display apparatus 11202 displays the image based on the image signal subjected to the image processing by the CCU 11201 under control of the CCU 11201.

The light source apparatus 11203 is configured of a light source such as light emitting diode (LED) or the like, and supplies an irradiation light to the endoscope 11100 when shooting a surgical site or the like.

An input apparatus 11204 is an input interface for the endoscopic surgery system 11000. A user can input various items of information or instructions into the endoscopic surgery system 11000 via the input apparatus 11204. For example, the user inputs an instruction or the like to change shooting conditions (such as kind of irradiation light, magnification, and focal distance) of the endoscope 11100.

A processing tool control apparatus 11205 controls to drive the energy treatment tool 11112 for cauterizing or cutting a tissue, sealing a blood vessel, and the like. A pneumoperitoneum apparatus 11206 feeds gas into the body cavity via the pneumoperitoneum tube 11111 to expand the body cavity of the patient 11132 in order to secure the field of view of the endoscope 11100 and to secure a working space of the operator. A recorder 11207 is an apparatus capable of recording various items of information regarding a surgery. A printer 11208 is an apparatus capable of printing various items of information regarding a surgery in various forms such as text, image, or graph.

Additionally, the light source apparatus 11203 for supplying an irradiation light to the endoscope 11100 when shooting a surgical site can be configured of a white light source including an LED, a laser light source, or a combination thereof, for example. In a case where the white light source is configured in a combination of RGB laser light sources, the output intensity and the output timing of each color (each wavelength) can be controlled with high accuracy, and thus the white balance of a shot image can be adjusted in the light source apparatus 11203. Further, in this case, the laser lights from the respective RGB laser light sources are irradiated on an object to be observed in a time division manner, and the imaging device in the camera head 11102 is controlled to be driven in synchronization with the irradiation timings, thereby shooting the images corresponding to RGB in a time division manner. According to the method, a color image can be obtained without a color filter in the imaging device.

Further, the light source apparatus 11203 may be controlled to be driven for changing the intensity of a light to be output at a predetermined time. The imaging device in the camera head 11102 is controlled to be driven in synchronization with the timings to change the intensities of the lights thereby to obtain images in a time division manner, and the images are combined thereby to generate an image with a high dynamic range without blocked-up shadows and blown-out highlights.

Further, the light source apparatus 11203 may be configured to supply a light in a predetermined wavelength band corresponding to special light observation. Under the special light observation, a light in a narrower band than an irradiation light (or white light) during normal observation is irradiated by use of the wavelength dependency of absorption of a light in a body tissue, thereby performing narrow band imaging for shooting a predetermined tissue such as blood vessel in the superficial portion of the mucous membrane at high contrast, for example. Alternatively, under the special light observation, fluorescent observation for obtaining an image by fluorescence caused by irradiating an excitation light may be performed. Under the fluorescent observation, an excitation light can be irradiated on a body tissue thereby to observe fluorescence from the body tissue (autofluorescence observation), a regent such as indocyanine green (ICG) can be locally injected into a body tissue, and an excitation light corresponding to the fluorescent wavelength of the regent can be irradiated on the body tissue thereby to obtain a fluorescent image, for example. The light source apparatus 11203 can be configured to supply a narrowband light and/or excitation light corresponding to the special light observation.

Figure 40:
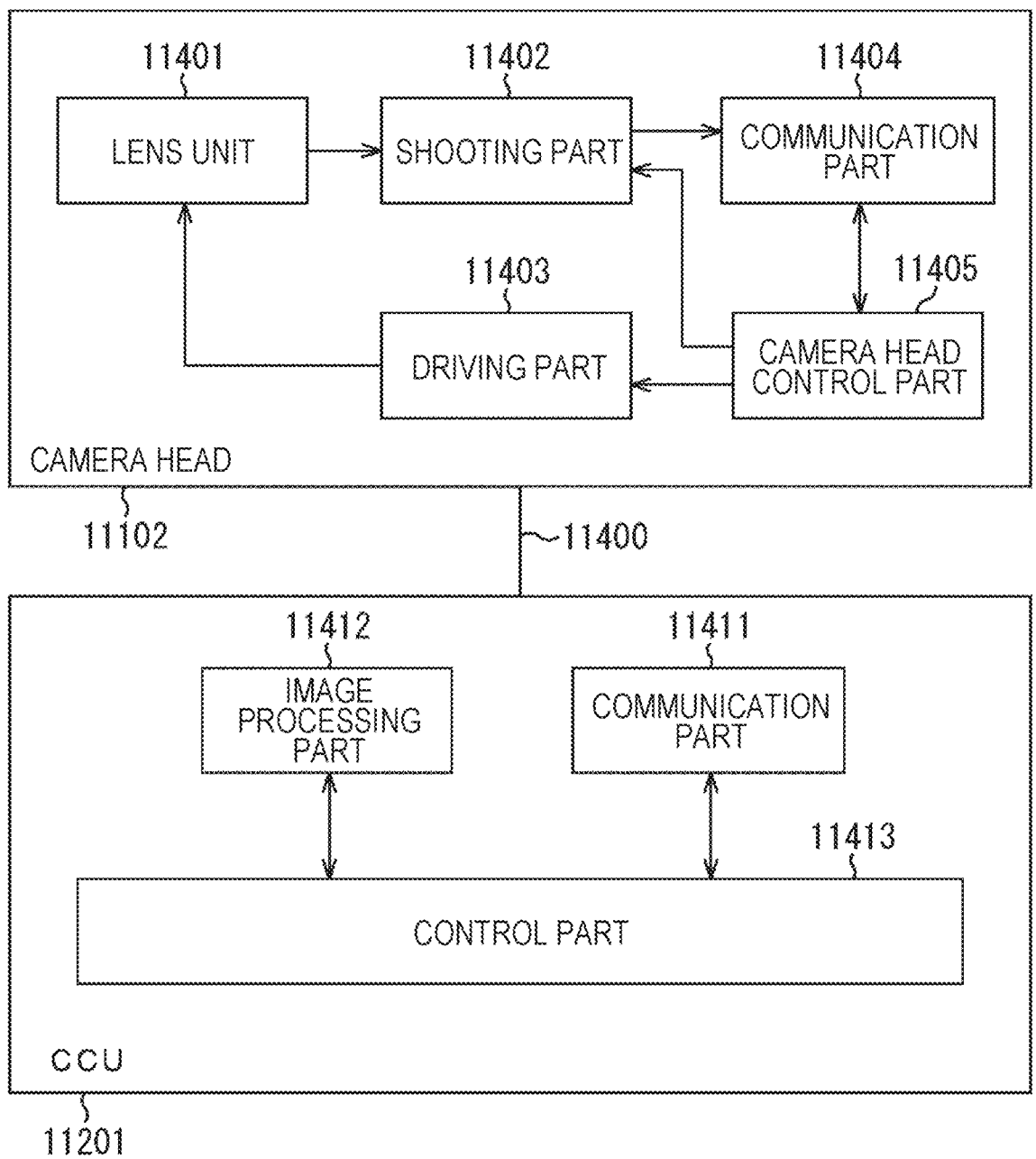
FIG. 40 is a block diagram illustrating an exemplary functional configuration of a camera head and a CCU.

FIG. 40 is a block diagram illustrating an exemplary functional configuration of the camera head 11102 and the CCU 11201 illustrated in FIG. 39.

The camera head 11102 has a lens unit 11401, a shooting part 11402, a driving part 11403, a communication part 11404, and a camera head control part 11405. The CCU 11201 has a communication part 11411, an image processing part 11412, and a control part 11413. The camera head 11102 and the CCU 11201 are communicably connected to each other via a transmission cable 11400.

The lens unit 11401 is an optical system provided at the connection part to the lens tube 11101. An observation light taken from the tip of the lens tube 11101 is guided to the camera head 11102, and is incident into the lens unit 11401. The lens unit 11401 is configured in a combination of a plurality of lenses including a zoom lens and a focus lens.

The shooting part 11402 may be configured of one imaging device (or single plate) or may be configured of a plurality of imaging devices (or multiplate). In a case where the shooting part 11402 is configured in multiplate, the image signals corresponding to RGB are generated by the imaging devices, respectively, and are combined thereby to obtain a color image, for example. Alternatively, the shooting part 11402 may have a pair of imaging devices for obtaining right-eye and left-eye image signals for 3 dimensional (D) display. 3D display is performed so that the operator 11131 can more accurately grasp the depth of a body tissue at a surgical site. Additionally, in a case where the shooting part 11402 is configured in multiplate, a plurality of lens units 11401 corresponding to the imaging devices can be provided, respectively.

Further, the shooting part 11402 may not necessarily be provided in the camera head 11102. For example, the shooting part 11402 may be provided immediately behind the objective lens inside the lens tube 11101.

The driving part 11403 is configured of an actuator, and moves the zoom lens and the focus lens in the lens unit 11401 by a predetermined distance along the optical axis under control of the camera head control part 11405. Thereby, the magnification and the focal point of an image shot by the shooting part 11402 can be adjusted as needed.

The communication part 11404 is configured of a communication apparatus for exchanging various items of information with the CCU 11201. The communication part 11404 transmits an image signal obtained from the shooting part 11402 as RAW data to the CCU 11201 via the transmission cable 11400.

Further, the communication part 11404 receives a control signal for controlling to drive the camera head 11102 from the CCU 11201, and supplies it to the camera head control part 11405. The control signal includes information regarding shooting conditions such as information for designating a frame rate of a shot image, information for designating an exposure value on shooting, and/or information for designating the magnification and the focal point of a shot image and the like, for example.

Additionally, the shooting conditions such as frame rate, exposure value, magnification, and focal point may be designated by the user as needed, or may be automatically set by the control part 11413 in the CCU 11201 on the basis of the obtained image signal. In the latter case, the auto exposure (AE) function, the auto focus (AF) function, and the auto white balance (AWB) function are mounted on the endoscope 11100.

The camera head control part 11405 controls to drive the camera head 11102 on the basis of the control signal from the CCU 11201 received via the communication part 11404.

The communication part 11411 is configured of a communication apparatus for exchanging various items of information with the camera head 11102. The communication part 11411 receives an image signal transmitted from the camera head 11102 via the transmission cable 11400.

Further, the communication part 11411 transmits the control signal for controlling to drive the camera head 11102 to the camera head 11102. The image signal or control signal can be transmitted via electric communication, optical communication, or the like.

The image processing part 11412 performs various image processing on the image signal as RAW data transmitted from the camera head 11102.

The control part 11413 performs various controls for shooting a surgical site or the like by the endoscope 11100 and displaying a shot image obtained by shooting a surgical site or the like. For example, the control part 11413 generates the control signal for controlling to drive the camera head 11102.

Further, the control part 11413 causes the display apparatus 11202 to display a shot image shooting a surgical site or the like therein on the basis of the image signal subjected to the image processing by the image processing part 11412. At this time, the control part 11413 may recognize various objects in the shot image by use of various image recognition technologies. For example, the control part 11413 detects the shapes, colors, and the like of the edges of the objects included in the shot image thereby to recognize a surgical tool such as forceps, a specific living body site, bleeding, mist during the use of the energy treatment tool 11112, and the like. When causing the display apparatus 11202 to display a shot image, the control part 11413 may overlap various items of surgery support information on the image of the surgical site to be displayed by use of the recognition result. The surgery support information is overlapped to be displayed, and is presented to the operator 11131 so that the loads on the operator 11131 can be alleviated and the operator 11131 can accurately perform the operation.

The transmission cable 11400 connecting the camera head 11102 and the CCU 11201 is an electric signal cable for communication of electric signals, an optical fiber for optical communication, or a composite cable thereof.

Here, wired communication is made by use of the transmission cable 11400 in the illustrated example, but wireless communication may be made between the camera head 11102 and the CCU 11201.

An exemplary endoscopic surgery system to which the technology according to the present disclosure can be applied has been described above. The technology according to the present disclosure can be applied to the camera head 11102 or the shooting part 11402 in the camera head 11102 among the above-described components, for example. Specifically, the imaging device 12 of FIG. 1 can be applied to the shooting part 11402, for example. The technology according to the present disclosure is applied to the shooting part 11402 so that a more detailed and more accurate image of a surgical site can be obtained and thus the operator can accurately confirm the surgical site.

Additionally, the endoscopic surgery system has been described herein by way of example, but the technology according to the present disclosure may be additionally applied to a microscopic surgery system and the like, for example.

<Application to Moving Object>

Further, the technology according to the present disclosure may be realized as an apparatus mounted on any kind of moving object such as vehicle, electric vehicle, hybrid vehicle, motorcycle, bicycle, personal mobility, airplane, drone, ship, or robot, for example.

Figure 41:
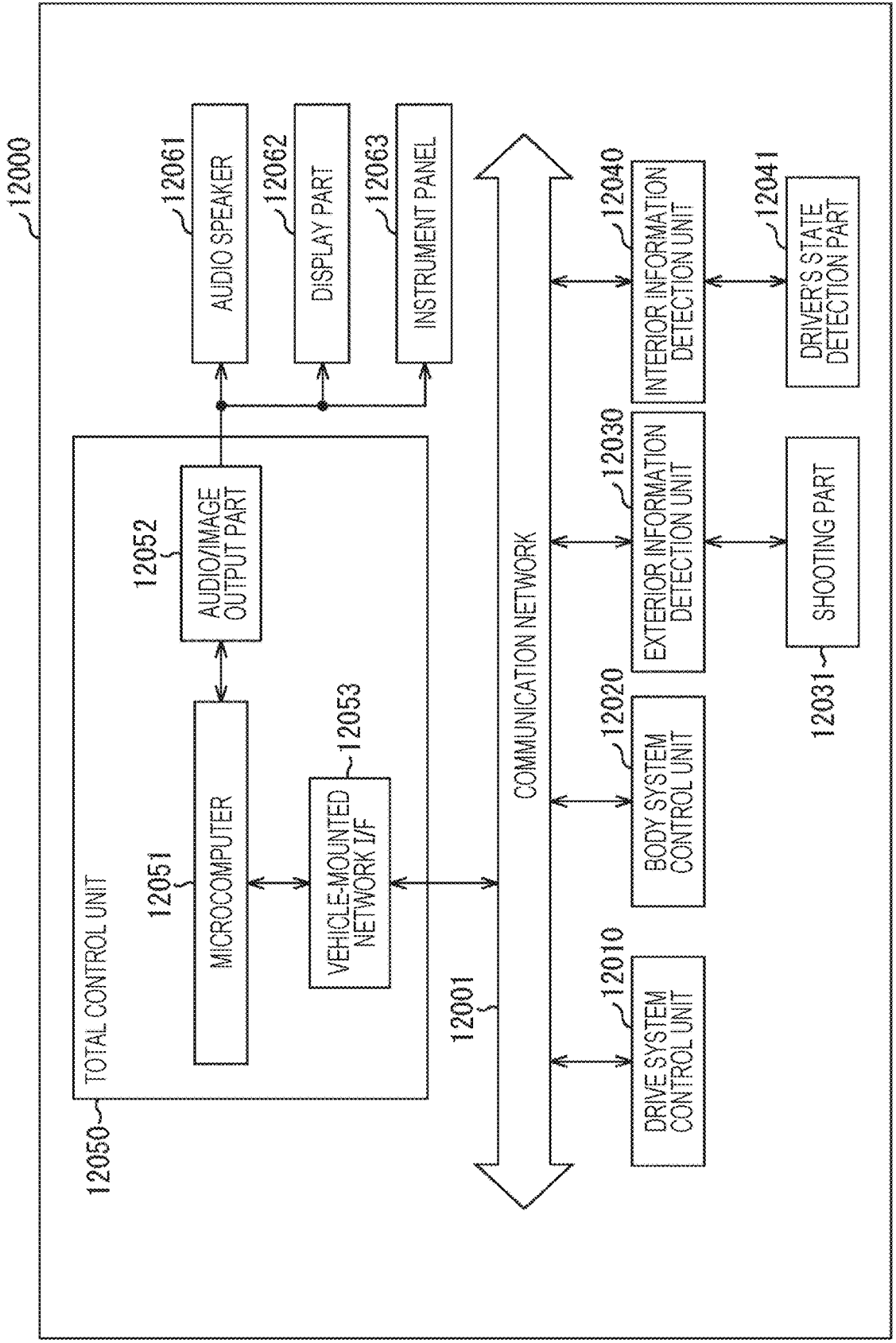
FIG. 41 is a block diagram illustrating an exemplary schematic configuration of a vehicle control system.

FIG. 41 is a block diagram illustrating an exemplary schematic configuration of a vehicle control system as an exemplary moving object control system to which the technology according to the present disclosure can be applied.

A vehicle control system 12000 includes a plurality of electronic control units connected via a communication network 12001. In the example illustrated in FIG. 41, the vehicle control system 12000 includes a drive system control unit 12010, a body system control unit 12020, an exterior information detection unit 12030, an interior information detection unit 12040, and a total control unit 12050. Further, a microcomputer 12051, an audio/image output part 12052, and a vehicle-mounted network interface (I/F) 12053 are illustrated as the functional components of the total control unit 12050.

The drive system control unit 12010 controls the operations of the apparatuses for the vehicle drive system according to various programs. For example, the drive system control unit 12010 functions as a control apparatus for a driving force generation apparatus such as internal engine or drive motor for generating a driving force of the vehicle, a driving force transmission mechanism for transmitting a driving force to the wheels, a steering mechanism for adjusting the steering angle of the vehicle, a braking apparatus for generating a braking force of the vehicle, and the like.

The body system control unit 12020 controls the operations of various apparatuses equipped in the vehicle body according to various programs. For example, the body system control unit 12020 functions as a control apparatus for a keyless entry system, a smart key system, a power window apparatus, or various lights such as head lights, back lights, brake light, directional signals, or fog light. In this case, the body system control unit 12020 can have a radio wave originated from a portable machine as a key, or signals of various switches input. The body system control unit 12020 receives the input of the radio wave or signals, and controls the door lock apparatus, the power window apparatus, the lights, and the like of the vehicle.

The exterior information detection unit 12030 detects the information indicating the exterior of the vehicle mounting the vehicle control system 12000 thereon. For example, the exterior information detection unit 12030 is connected with a shooting part 12031. The exterior information detection unit 12030 causes the shooting part 12031 to shoot an image of the exterior of the vehicle, and receives the shot image. The exterior information detection unit 12030 may perform processing of detecting an object such as person, vehicle, obstacle, road sign, or character on the road, or a distance detection processing on the basis of the received image.

The shooting part 12031 is a light sensor for receiving a light and outputting an electric signal depending on the amount of received light. The shooting part 12031 can output the electric signal as an image, or can output it as distance measurement information. Further, a light received by the shooting part 12031 may be a visible ray or a non-visible ray such as infrared ray.

The interior information detection unit 12040 detects the information indicating the interior of the vehicle. The interior information detection unit 12040 is connected with a driver's state detection part 12041 for detecting a driver's state, for example. The driver's state detection part 12041 includes a camera for shooting the driver, for example, and the interior information detection unit 12040 may calculate a degree of fatigue or a degree of concentration of the driver or may determine whether the driver is asleep at the wheel on the basis of the detection information input from the driver's state detection part 12041.

The microcomputer 12051 can calculate a control target value of the driving force generation apparatus, the steering mechanism, or the braking apparatus on the basis of the information indicating the exterior or interior of the vehicle obtained by the exterior information detection unit 12030 or the interior information detection unit 12040, and can output a control instruction to the drive system control unit 12010. For example, the microcomputer 12051 can perform cooperative control for realizing the advanced driver assistance system (ADAS) functions including collision avoidance or collision alleviation of the vehicle, follow-up traveling based on inter-vehicle distance, traveling at kept vehicle speed, collision alarm of the vehicle, lane deviation alarm of the vehicle, and the like.

Further, the microcomputer 12051 controls the driving force generation apparatus, the steering mechanism, the braking apparatus, or the like on the basis of the information indicating the surrounding of the vehicle obtained by the exterior information detection unit 12030 or the interior information detection unit 12040, thereby performing cooperative control for automatic driving of autonomous traveling irrespective of driver's operation, and the like.

Further, the microcomputer 12051 can output a control instruction to the body system control unit 12020 on the basis of the information indicating the exterior of the vehicle obtained by the exterior information detection unit 12030. For example, the microcomputer 12051 can control the head lights depending on the position of a leading vehicle or an oncoming vehicle detected by the exterior information detection unit 12030, and can perform cooperative control in order to achieve anti-glare such as switching from high beam to low beam.

The audio/image output part 12052 transmits an output signal of at least one of audio or image to an output apparatus capable of visually or aurally notifying information to the passengers in the vehicle or the outside of the vehicle. In the example of FIG. 41, an audio speaker 12061, a display part 12062, and an instrument panel 12063 are illustrated as output apparatuses by way of example. The display part 12062 may include at least one of an on-board display and a head-up display, for example.

Figure 42:
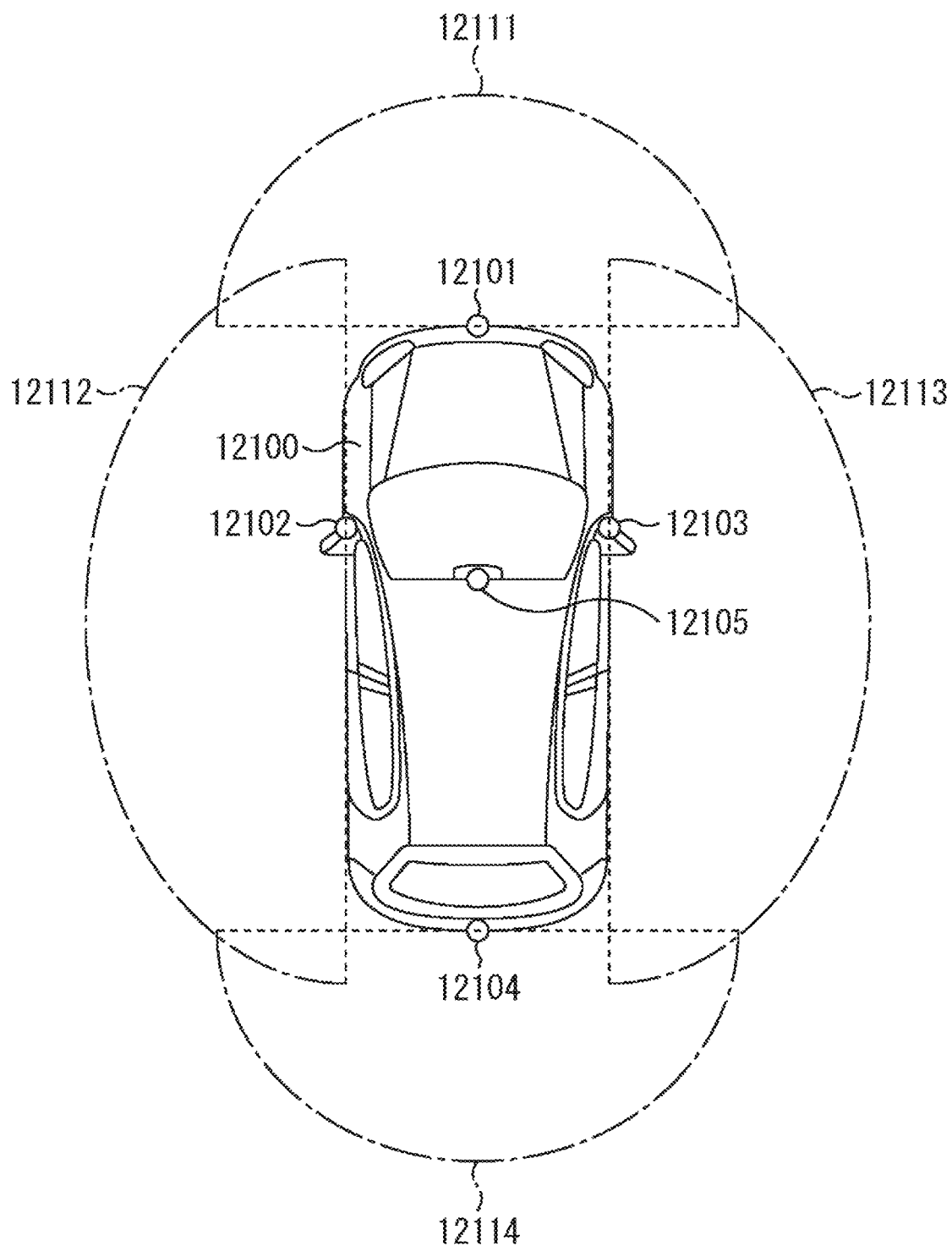
FIG. 42 is an explanatory diagram illustrating exemplary installation positions of an exterior information detection part and shooting parts.

FIG. 42 is a diagram illustrating exemplary installation positions of the shooting part 12031.

In FIG. 42, the shooting part 12031 has shooting parts 12101, 12102, 12103, 12104, and 12105.

The shooting parts 12101, 12102, 12103, 12104, and 12105 are provided at the front nose, the side mirrors, the rear bumper or back door of the vehicle 12100, and at the top part of the front shield inside the vehicle, and the like, respectively, for example. The shooting part 12101 provided at the front nose and the shooting part 12105 provided at the top part of the front shield inside the vehicle mainly obtain images in front of the vehicle 12100. The shooting parts 12102 and 12103 provided at the side mirrors mainly obtain images on both sides of the vehicle 12100. The shooting part 12104 provided at the rear bumper or back door mainly obtains an image behind the vehicle 12100. The shooting part 12105 provided at the top part of the front shield inside the vehicle is mainly used to detect a leading vehicle, a pedestrian, an obstacle, a traffic light, a road sign, a traffic lane, or the like.

Additionally, FIG. 42 illustrates exemplary shooting ranges of the shooting parts 12101 to 12104. A shooting range 12111 indicates a shooting range of the shooting part 12101 provided at the front nose, the shooting ranges 12112 and 12113 indicate the shooting ranges of the shooting parts 12102 and 12103 provided at the side mirrors, respectively, and a shooting range 12114 indicates a shooting range of the shooting part 12104 provided at the rear bumper or back door. For example, the image data shot by the shooting parts 12101 to 12104 are overlapped thereby to obtain a perspective image of the vehicle 12100 viewed from above.

At least one of the shooting parts 12101 to 12104 may have a function of obtaining distance information. For example, at least one of the shooting parts 12101 to 12104 may be a stereo camera configured of a plurality of imaging devices, or may be an imaging device having pixels for phase difference detection.

For example, the microcomputer 12051 finds a distance to each stereoscopic object in the shooting ranges 12111 to 12114 and a temporal change in the distance (relative speed to the vehicle 12100) on the basis of the distance information obtained from the shooting parts 12101 to 12104, thereby extracting, as a leading vehicle, a stereoscopic object traveling at a predetermined speed (0 km/h or more, for example) substantially in the same direction as the vehicle 12100, which is the closest stereoscopic object to the vehicle 12100 on the road. Further, the microcomputer 12051 can set an inter-vehicle distance to be previously secured behind the leading vehicle, and can perform automatic brake control (including follow-up stop control), automatic acceleration control (including follow-up start control), or the like. Cooperative control for automatic driving of autonomous traveling irrespective of driver's operation, and the like can be performed in this way.

For example, the microcomputer 12051 can classify and extract stereoscopic data regarding stereoscopic objects into two-wheel vehicle, standard-sized vehicle, large-sized vehicle, pedestrian, power pole, and the like on the basis of the distance information obtained from the shooting parts 12101 to 12104, and can use it for automatic obstacle avoidance. For example, the microcomputer 12051 discriminates the obstacles around the vehicle 12100 as obstacles capable of being visually confirmed by the driver of the vehicle 12100 or obstacles difficult to visually confirm. The microcomputer 12051 then determines a collision risk indicating a degree of risk of collision with each obstacle, and outputs an alarm to the driver via the audio speaker 12061 or the display part 12062 or performs forcible deceleration or avoidance steering via the drive system control unit 12010 when there is a collision possibility at a set value of collision risk, thereby performing driving support for collision avoidance.

At least one of the shooting parts 12101 to 12104 may be an infrared camera for detecting an infrared ray. For example, the microcomputer 12051 determines whether a pedestrian is present in the images shot by the shooting parts 12101 to 12104, thereby recognizing the pedestrian. The pedestrian is recognized in a procedure of extracting the characteristic points in the images shot by the shooting parts 12101 to 12104 as infrared cameras and a procedure of performing a pattern matching processing on a series of characteristic points indicating the contour of an object and determining whether the contour of the object is a pedestrian, for example. When the microcomputer 12051 determines that a pedestrian is present in the images shot by the shooting parts 12101 to 12104 and recognizes the pedestrian, the audio/image output part 12052 controls the display part 12062 to overlap a square contour line for emphasis on the recognized pedestrian for display. Further, the audio/image output part 12052 may control the display part 12062 to display an icon or the like indicating a pedestrian at a desired position.

An exemplary vehicle control system to which the technology according to the present disclosure can be applied has been described above. The technology according to the present disclosure can be applied to the shooting part 12031 among the above-described components, for example. Specifically, for example, the shooting apparatus 10 of FIG. 1 can be applied to the shooting part 12031. The technology according to the present disclosure is applied to the shooting part 12031 thereby to obtain more detailed and more accurate information indicating the exterior of the vehicle and to realize an enhancement in safety of automatic driving, for example.

Additionally, embodiments of the present technology are not limited to the above embodiments, and can be variously changed without departing from the scope of the present technology.

<Exemplary Combinations of Configurations>

Additionally, the present technology can take the following configurations, for example.

(1)

An imaging device including:

a pixel array including an effective region used for obtaining an image and a surrounding region around the effective region, in which a plurality of kinds of first optical filters configured to transmit a light with a respective different wavelength are provided in respective pixels in the effective region, a second optical filter having a transmission band with a shorter bandwidth than a bandwidth of a transmission band of the first optical filters is provided in a first pixel in the surrounding region, and a third optical filter with a difference in transmission band from the second optical filter of a predetermined wavelength or more, or with a transmissivity equal to or lower than a transmissivity of the second optical filter is provided in a second pixel adjacent to the first pixel.

(2)

The imaging device according to (1), in which a difference between a peak wavelength of the second optical filter and a peak wavelength of the third optical filter is the predetermined wavelength or more.

(3)

The imaging device according to (1), in which a transmissivity at a peak wavelength of the third optical filter is equal to or lower than a transmissivity at a peak wavelength of the second optical filter.

(4)

The imaging device according to (3), in which in a case where a difference in transmission band between the second optical filter and the third optical filter is less than the predetermined wavelength, a difference between the transmissivity at the peak wavelength of the second optical filter and the transmissivity at the peak wavelength of the third optical filter is a predetermined threshold or more.

(5)

The imaging device according to any of (1) to (4), in which a light shield film is provided on a light incident side of the second pixel, and the light shield film is not provided on a light incident side of the first pixel.

(6)

The imaging device according to any of (1) to (5), in which an optical filter with a similar transmission band to a transmission band of the second optical filter is provided in a third pixel with the same image height as an image height of the second pixel.

(7)

The imaging device according to any of (1) to (6), in which the second optical filter is a plasmon filter.

(8)

The imaging device according to any of (1) to (7), in which the third optical filter is any of the plurality of kinds of first optical filters.

(9)

An electronic apparatus including:
an imaging device; and
a signal processing part configured to process a signal output from the imaging device,
in which the imaging device includes a pixel array including an effective region used for obtaining an image and a surrounding region around the effective region,
a plurality of kinds of first optical filters configured to transmit a light with a respective different wavelength are provided in respective pixels in the effective region,
a second optical filter having a transmission band with a smaller bandwidth than a bandwidth of a transmission band of the first optical filters is provided in a first pixel in the surrounding region, and
a third optical filter with a difference in transmission band from the second optical filter of a predetermined wavelength or more, or with a transmissivity equal to or lower than a transmissivity of the second optical filter is provided in a second pixel adjacent to the first pixel.

REFERENCE SIGNS LIST

10 Shooting apparatus
11 Optical system
12, 12A to 12C Imaging device
14 Signal processing part
31 Pixel array
31A Effective region
31B Surrounding region
51 Pixel
61 Photodiode
101 On-chip microlens
102 Interlayer film
103 Narrowband filter layer
104 Interlayer film
105 Photoelectric conversion device layer
106 Signal wiring layer
107 Color filter layer
108 Filter layer
121A to 121D Plasmon filter
131A to 131C Conductive thin film
132A to 132C' Hole
133A, 133B Dot
134A, 134B Dielectric layer
151 Plasmon filter
161A Conductive thin film
162 SiO2 film
163 SiN film
164 SiO2 substrate
203, 221 Semiconductor chip
301 Lens
351 to 354 Pixel block
NB Narrowband filter
P Transmission filter

The invention claimed is:

1. An imaging device comprising:
a pixel array including an effective region used for obtaining an image and a surrounding region arranged around the effective region,
wherein the effective region includes a plurality of kinds of first optical filters configured to transmit a light with a respective different wavelength in respective pixels in the effective region, and
wherein the surrounding region includes:
a first pixel including a second optical filter having a transmission band with a shorter bandwidth than a bandwidth of a transmission band of the first optical filters, and
a second pixel adjacent to the first pixel, the second pixel including a third optical filter with a difference in transmission band from the second optical filter of a predetermined wavelength or more, or with a transmissivity equal to or lower than a transmissivity of the second optical filter, wherein the third optical filter is any of the plurality of kinds of first optical filters included in the effective region.

2. The imaging device according to claim 1, wherein a difference between a peak wavelength of the second optical filter and a peak wavelength of the third optical filter is the predetermined wavelength or more.

3. The imaging device according to claim 1, wherein a transmissivity at a peak wavelength of the third optical filter is equal to or lower than a transmissivity at a peak wavelength of the second optical filter.

4. The imaging device according to claim 3, wherein in a case where a difference in transmission band between the second optical filter and the third optical filter is less than the predetermined wavelength, a difference between the transmissivity at the peak wavelength of the second optical filter and the transmissivity at the peak wavelength of the third optical filter is a predetermined threshold or more.

5. The imaging device according to claim 1, wherein a light shield film is provided on a light incident side of the second pixel, and the light shield film is not provided on a light incident side of the first pixel.

6. The imaging device according to claim 1, wherein an optical filter with a similar transmission band to a transmission band of the second optical filter is provided in a third pixel with a same image height as an image height of the second pixel.

7. The imaging device according to claim 1, wherein the second optical filter is a plasmon filter.

8. An electronic apparatus comprising:
an imaging device; and
a signal processing part configured to process a signal output from the imaging device,
wherein
the imaging device comprises a pixel array including an effective region used for obtaining an image and a surrounding region around the effective region, the effective region includes a plurality of kinds of first optical filters configured to transmit a light with a respective different wavelength in respective pixels in the effective region, the surrounding region includes:
- a first pixel including a second optical filter having a transmission band with a smaller bandwidth than a bandwidth of a transmission band of the first optical filters, and
- a second pixel adjacent to the first pixel, the second pixel including a third optical filter with a difference in transmission band from the second optical filter of a predetermined wavelength or more, or with a transmissivity equal to or lower than a transmissivity of the second optical filter, wherein the third optical filter is any of the plurality of kinds of first optical filters provided in the effective region.

* * * * *